US011475181B2

(12) United States Patent
Lehman et al.

(10) Patent No.: US 11,475,181 B2
(45) Date of Patent: Oct. 18, 2022

(54) SYSTEM AND METHOD FOR FACILITATING INSTALLATION OF USER NODES IN FIXED WIRELESS DATA NETWORK

(71) Applicant: Starry, Inc., Boston, MA (US)

(72) Inventors: Donald Lehman, Brooklyn, NY (US); Colin Reisterer, Boston, MA (US); Noah Greene, Boston, MA (US)

(73) Assignee: Starry, Inc., Boston, MA (US)

( * ) Notice: Subject to any disclaimer, the term of this patent is extended or adjusted under 35 U.S.C. 154(b) by 712 days.

(21) Appl. No.: 16/376,183

(22) Filed: Apr. 5, 2019

(65) Prior Publication Data

US 2019/0311080 A1 Oct. 10, 2019

Related U.S. Application Data

(60) Provisional application No. 62/653,070, filed on Apr. 5, 2018.

(51) Int. Cl.
*G06F 30/20* (2020.01)
*G06T 19/00* (2011.01)
(Continued)

(52) U.S. Cl.
CPC ............ *G06F 30/20* (2020.01); *G06T 19/003* (2013.01); *H04L 67/34* (2013.01); *H04L 67/52* (2022.05); *H04W 4/02* (2013.01); *H04W 4/50* (2018.02)

(58) Field of Classification Search
CPC ........... G06F 30/20; H04W 4/50; H04W 4/02; G06T 19/003; H04L 67/18; G04L 67/34
See application file for complete search history.

(56) References Cited

U.S. PATENT DOCUMENTS 9,736,649 B1 8/2017 Do et al.
10,517,021 B2 * 12/2019 Feldman ............. H04L 65/1006
(Continued)

FOREIGN PATENT DOCUMENTS

WO WO2014161566 10/2014
WO WO2017063681 4/2017

OTHER PUBLICATIONS

Jiang P, Zhang Y, Fu W, Liu H, Su X. Indoor mobile localization based on Wi-Fi fingerprint's important access point. International Journal of Distributed Sensor Networks. Apr. 9, 2015;11(4):429104. (Year: 2015).*

(Continued)

*Primary Examiner* — Chuen-Meei Gan
(74) *Attorney, Agent, or Firm* — HoustonHogle LLP

(57) ABSTRACT

A mobile application for facilitating installation of the user nodes in a fixed wireless network utilizes augmented reality to provide location, usage, and recommendation information about nearby service nodes. A camera of the mobile computing device captures image data depicting the surrounding area, which is displayed on a touchscreen display of the mobile computing device with graphical elements including icons and textual information overlaid on the captured image data in different positions and with different visual characteristics based on geometric information for the mobile computing device and the surrounding area, the relative position of nearby service nodes with respect to the mobile computing device, and information about the service nodes such as typical usage and/or whether the service node is recommended or not. A virtual antenna is also overlaid on the image data, and an image depicting the virtual antenna as it would look once installed is generated and stored.

32 Claims, 24 Drawing Sheets

(51) Int. Cl.
*H04L 67/00* (2022.01)
*H04W 4/02* (2018.01)
*H04W 4/50* (2018.01)
*H04L 67/52* (2022.01)

(56) References Cited

U.S. PATENT DOCUMENTS

| | | | | |
|---|---|---|---|---|
| 2008/0268876 | A1* | 10/2008 | Gelfand | H04W 4/029 |
| | | | | 455/457 |
| 2008/0284669 | A1 | 11/2008 | Hunton et al. | |
| 2011/0025494 | A1* | 2/2011 | Adcook | G01S 5/0284 |
| | | | | 340/539.13 |
| 2011/0066375 | A1 | 3/2011 | France et al. | |
| 2011/0288771 | A1* | 11/2011 | Mazlum | G01S 19/50 |
| | | | | 701/469 |
| 2012/0286997 | A1* | 11/2012 | Lin | G01S 5/0252 |
| | | | | 342/451 |
| 2013/0135146 | A1 | 5/2013 | Ransom et al. | |
| 2014/0080514 | A1* | 3/2014 | Das | G01C 21/206 |
| | | | | 455/456.1 |
| 2014/0205205 | A1 | 7/2014 | Neubauer | |
| 2014/0273920 | A1* | 9/2014 | Smith | H04W 4/08 |
| | | | | 455/404.2 |
| 2014/0368382 | A1* | 12/2014 | Vartanian | G01S 19/17 |
| | | | | 342/357.55 |
| 2015/0381293 | A1 | 12/2015 | Hardy et al. | |
| 2017/0180938 | A1* | 6/2017 | Smith | H04M 1/72457 |
| 2017/0238136 | A1* | 8/2017 | Smith | H04M 1/72421 |
| | | | | 455/456.3 |

OTHER PUBLICATIONS

International Preliminary Report on Patentability dated Jul. 6, 2020, from International Application No. PCT/US2019/025964, filed on Apr. 5, 2019. 21 pages.

Anonymous, "Pokemon Go," Wikipedia, 1-44 (2016).

International Search Report and Written Opinion of the International Searching Authority, dated Jun. 24, 2019, from International Application No. PCT/US2019/025964, filed on Apr. 5, 2019. 17 pages.

* cited by examiner

SYSTEM AND METHOD FOR FACILITATING INSTALLATION OF USER NODES IN FIXED WIRELESS DATA NETWORK

RELATED APPLICATIONS

This application claims the benefit under 35 USC 119(e) of U.S. Provisional Application No. 62/653,070, filed on Apr. 5, 2018, which is incorporated herein by reference in its entirety.

BACKGROUND OF THE INVENTION

Internet service providers (ISPs) have historically used a number of different technologies in their subscriber or access networks to deliver network connectivity to premises such as homes, multidwelling units, and businesses. Initially premises were connected via dial-up connections over POTS lines, or ISDN. Often businesses used T-1 to T-3 connections.

Nowadays, DSL, cable and optical fiber networks are common in urban and metropolitan areas to provide network access.

Fixed wireless network access is another option in some areas. ISPs providing the wireless network access can transmit and receive data to and from user nodes (usually installed at premises including buildings such as homes, apartment buildings or office buildings, among other examples) as radio waves via transmission towers. This has been typically used in rural areas where cable and optical fiber networks are not available.

Recently, systems have been proposed to utilize high frequency wireless data networks, typically operating in the 10 GHz to 300 GHz band for communications between service nodes and user nodes. This spectral band encompasses millimeter wavelengths (mm-wave) that are typically described as covering the 30 GHz to 300 GHz frequency band.

SUMMARY OF THE INVENTION

Fixed wireless access networks require user nodes to be installed at the premises. Installation of the user nodes involves finding optimal placement within the premises: installation height and directional alignment (pointing toward a specific service node), among other considerations.

Additionally, it is often desirable to produce mockups, or images depicting the user node installation, in order to communicate how the user node will look once it is installed and also to show installation technicians where the user nodes should be installed, among other benefits.

The presently disclosed system includes a mobile application for facilitating the installation of the user nodes. The mobile application executes on a mobile computing device (e.g. a smartphone or tablet) and utilizes augmented reality technology to provide information about nearby service nodes, including location information and usage information. Installation recommendations are also provided.

A camera of the mobile computing device captures image data depicting the surrounding area, which is displayed on a touchscreen display of the mobile computing device. Graphical elements including icons and textual information are overlaid on the captured image data in different positions and with different visual characteristics based on geometric information for the mobile computing device and the surrounding area, the relative position of nearby service nodes with respect to the mobile computing device, and information about the service nodes such as typical usage and/or whether the service node is recommended or not. In this way, a user, such as a technician or a customer, can scan the surrounding area using the mobile computing device in order to choose the best position and direction for the user node.

Additionally, a virtual antenna, or graphical element representing the user node to be installed, can be overlaid on the image data depicting the surrounding area, and an image depicting the virtual antenna as it would look once installed can be generated and stored. This dramatically reduces the time needed to communicate a mockup to all involved parties who need a visualization of the installation. Technicians can also quickly visualize multiple installation points and multiple installation configurations.

In general, according to one aspect, the invention features a system for facilitating installation of a user node in a fixed wireless data network. A mobile computing device comprises a display for presenting a graphical user interface and executes a mobile application, which uses position information for service nodes to facilitate installation of the user node.

In embodiments, the position information for the service nodes includes the position of the service nodes with respect to the mobile computing device and/or area of coverage information for the service nodes, and the position information is generated based on global navigation satellite system location data for the mobile computing device.

Graphical elements representing the service nodes are displayed in different positions based on the position information. In one example (e.g. using a smart phone), the mobile application renders image data depicting a surrounding area captured by a camera of the mobile computing device on the display with the graphical elements overlaid on the image data in different positions with respect to regions of the image data corresponding to positions of the service nodes. In another example (e.g. using augmented reality or smart glasses), the mobile application superimposes the graphical elements into a field of view of a user via the display in different positions with respect to visible portions of the surrounding area in the field of view of the user based on image data captured by a camera of the mobile computing device and the position information. The different positions of the graphical elements representing the service nodes are based on geometric information of the mobile computing device and an area surrounding the mobile computing device. Visual characteristics of the graphical elements representing the service nodes are based on recommendation information for the service nodes, which can include whether the service nodes are recommended and/or recommended heights of installation of the user node. The recommendation information can also be based on usage information for the service nodes.

In general, according to another aspect, the invention features a system for facilitating the installation of a user node in a fixed wireless data network. A mobile computing device executes a mobile application and renders a graphical user interface on a touchscreen display of the mobile computing device. The mobile application generates geometric information for the mobile computing device and an area surrounding the mobile computing device. The graphical user interface displays image data captured by a camera of the mobile computing device and displays a graphical element representing the user node in a position with respect to the image data, based on the geometric information.

In embodiments, visual characteristics of the graphical element representing the user node are based on input detected by the graphical user interface, and the mobile application generates and stores an image depicting the image data and the graphical element representing the user node that were displayed by the graphical user interface.

In general, according to another aspect, the invention features a method for facilitating installation of a user node in a fixed wireless data network. A mobile application executing on a mobile computing device presents a graphical user interface and uses position information for service nodes to facilitate installation of the user node.

In general, according to another aspect, the invention features a method for facilitating the installation of a user node in a fixed wireless data network. A mobile application executing on a mobile computing device renders a graphical user interface on a touchscreen display of the mobile computing device and generates geometric information for the mobile computing device and an area surrounding the mobile computing device. The graphical user interface displays image data captured by a camera of the mobile computing device and a graphical element representing the user node in a position with respect to the image data, based on the geometric information.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
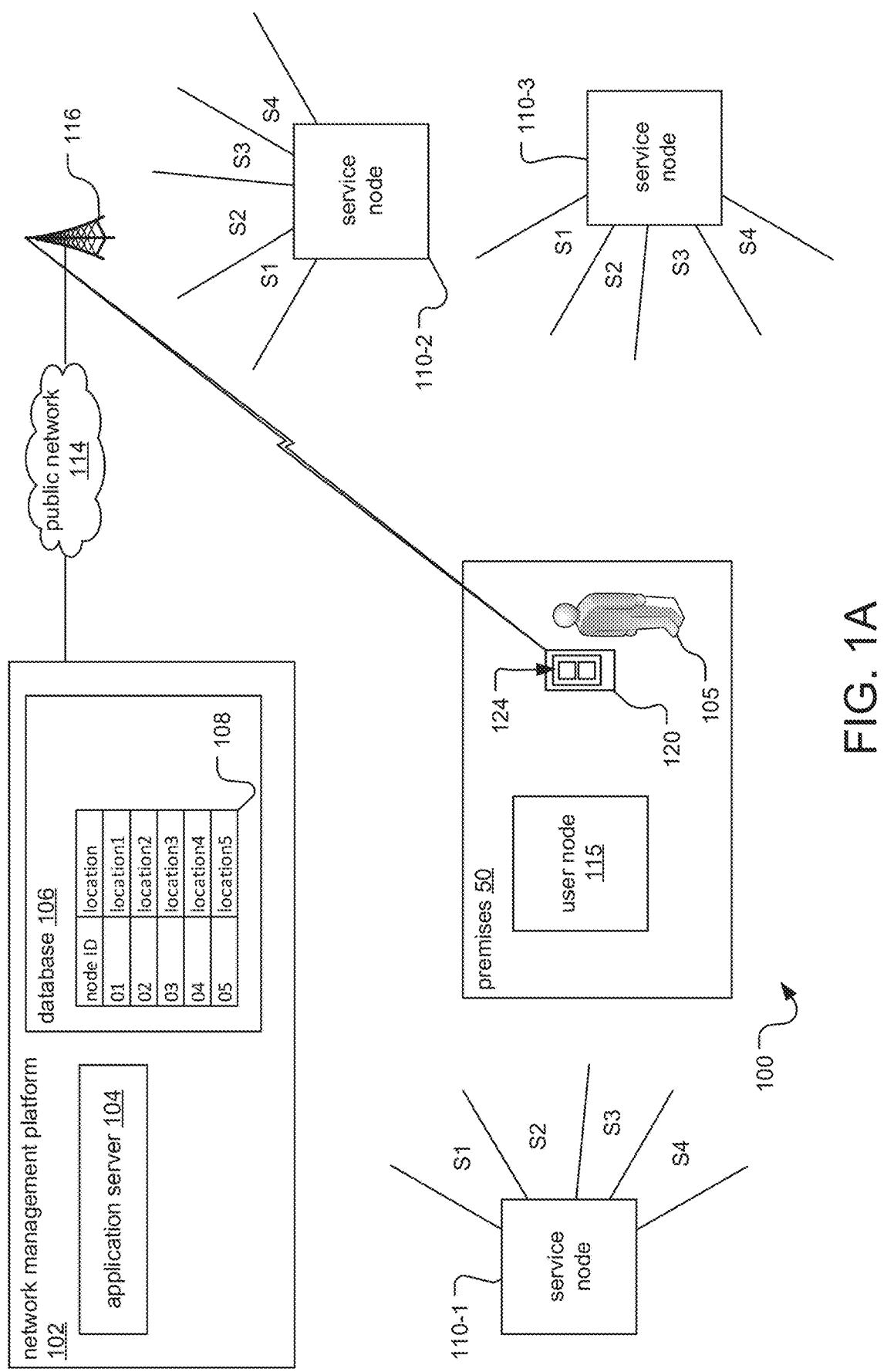
FIG. 1A is a schematic diagram of an exemplary fixed wireless data network to which the present invention is applicable.

FIG. 1A is a schematic diagram of an exemplary fixed wireless data network 100 to which the present invention is applicable. In general, the current invention includes a system and method for facilitating the installation of user nodes 115 in the fixed wireless data network 100.

The fixed wireless data network 100 includes a user node 115 to be installed at a premises 50 such as a home, multi dwelling unit building or office building, and service nodes 110-1, 110-2, 110-3, which are distributed throughout a geographical area in the vicinity of the premises 50, for example, at varying distances away from the premises 50. Both the service nodes 110 and the user nodes 115 are installed or constructed at fixed points and communicate wirelessly via directional antenna systems, each of which, for example, typically covers an azimuthal arc of 10's to 100's of degrees.

In one example, the area of coverage for each service node 110 is divided into multiple subsectors S1, S2, . . . , Sn, which are distributed in an azimuthal fan, with the subsectors adjoining one another. The directional antenna systems of the service nodes 110 can be phased array antenna systems, which form transmit and receive beams that correspond to each of the subsectors, among other examples.

In one example, the fixed wireless data network 100 is a subscriber or access network for an internet service provider (ISP), delivering network connectivity to the premises 50.

At the premises 50, a user 105 operates a mobile computing device 120. The user 105 can be an individual that is actually performing the installation of the user node 115 such as the homeowner, a technician or a customer of an ISP, or otherwise any individual involved with the installation such as a site surveyor for the ISP or a property manager, among other examples.

In the illustrated example, the mobile computing device 120 is a smartphone device. Alternatively, the mobile computing device 120 could be a laptop computer, tablet computer, phablet computer (i.e., a mobile device that is typically larger than a smart phone, but smaller than a tablet), smart glasses, or augmented reality (AR) glasses, to list a few examples.

A mobile application 124 executing on the mobile computing device 120 facilitates the installation of the user node 115 at the premises 50, in general, using data available to the mobile application 124 locally (such as sensor data) and/or remotely.

The mobile application 124 communicates via a public network 114 (such as the internet) with a network management platform 102. The network management platform 102, which includes an application server 104 and a database 106, maintains node information, including identification information and/or location information for the service nodes 110. This information is stored in the database 106, and the application server 104 receives location information for the mobile computing device 120 (for example, indicating the current location of the mobile computing device 120) and returns node information to the mobile application 124 via the public network 114. In the illustrated example, the node identification and location information is listed in a node table 108 of the database 106.

The location information for the service nodes 110 includes information indicating the locations of the service nodes 110 such as global navigation satellite system (GLASS) data (for example, GPS coordinates: longitude and latitude), and/or address information, as well as information indicating the areas of coverage for the service nodes 110.

Figure 1B:
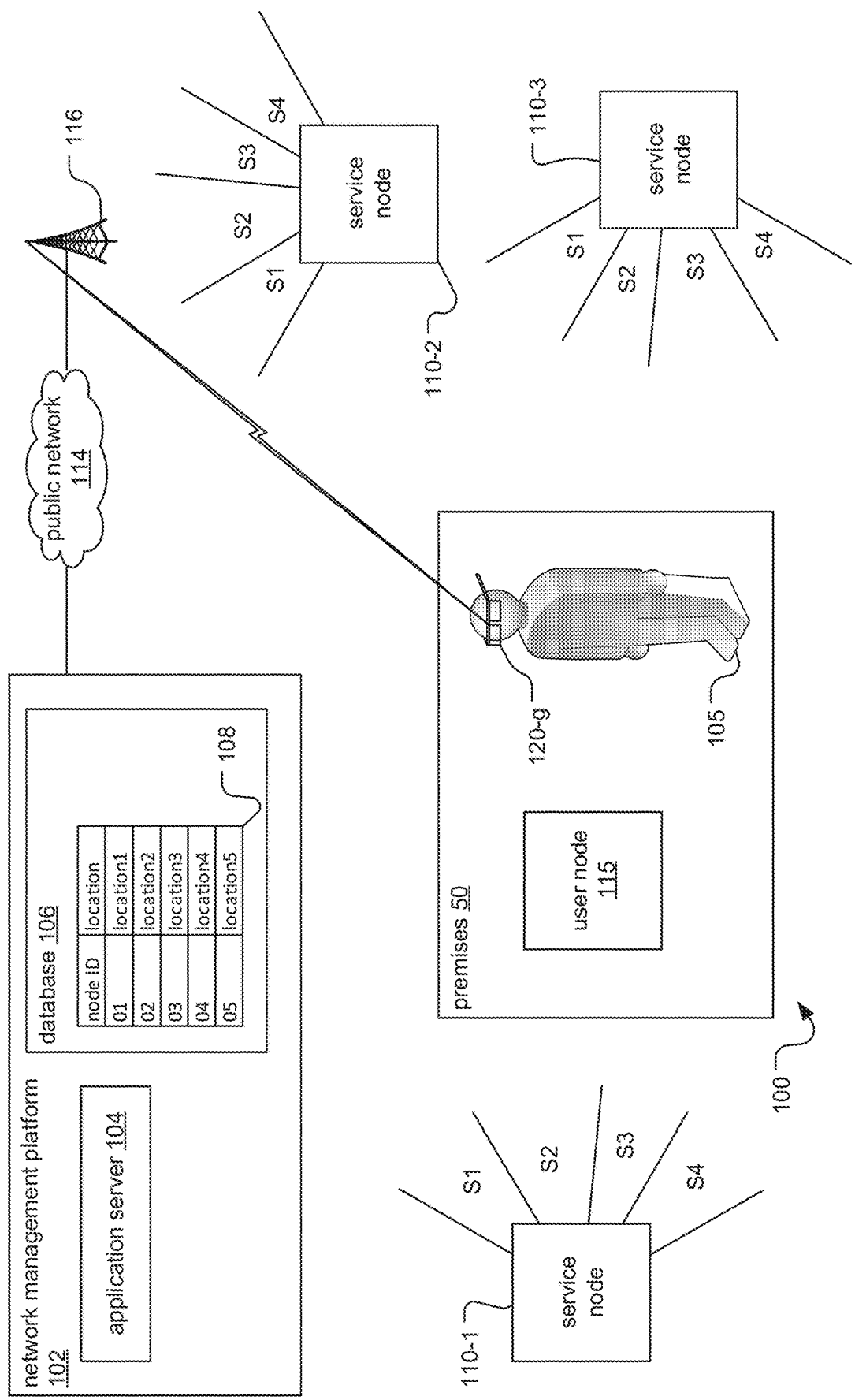
FIG. 1B is a schematic diagram of the fixed wireless data network according to an embodiment of the invention including augmented reality (AR) glasses worn by a user.

FIG. 1B is a diagram of the fixed wireless data network 100 according to another embodiment of the invention. The system is similar to that described with respect to FIG. 1A. Now, however, the mobile computing device 120 is specifically a set of smart glasses 120-g worn by the user 105.

In one embodiment, the smart glasses 120-g include transparent lenses through which the user 105 views the surrounding environment, and the smart glasses 120-g superimpose information onto the field of view of the user 105 using augmented reality (AR) technology. Commercial examples of the smart glasses 120-g include the HoloLens® mixed reality smart glasses, offered by Microsoft, and the Magic Leap One® head-mounted virtual retinal display device, offered by Magic Leap, among other examples.

In the illustrated embodiment, the smart glasses 120-g wirelessly connects to the public network 114 and executes the mobile application 124 for facilitating the installation of the user node 115.

In another embodiment, the smart glasses 120-g are a virtual reality headset.

Figure 1C:
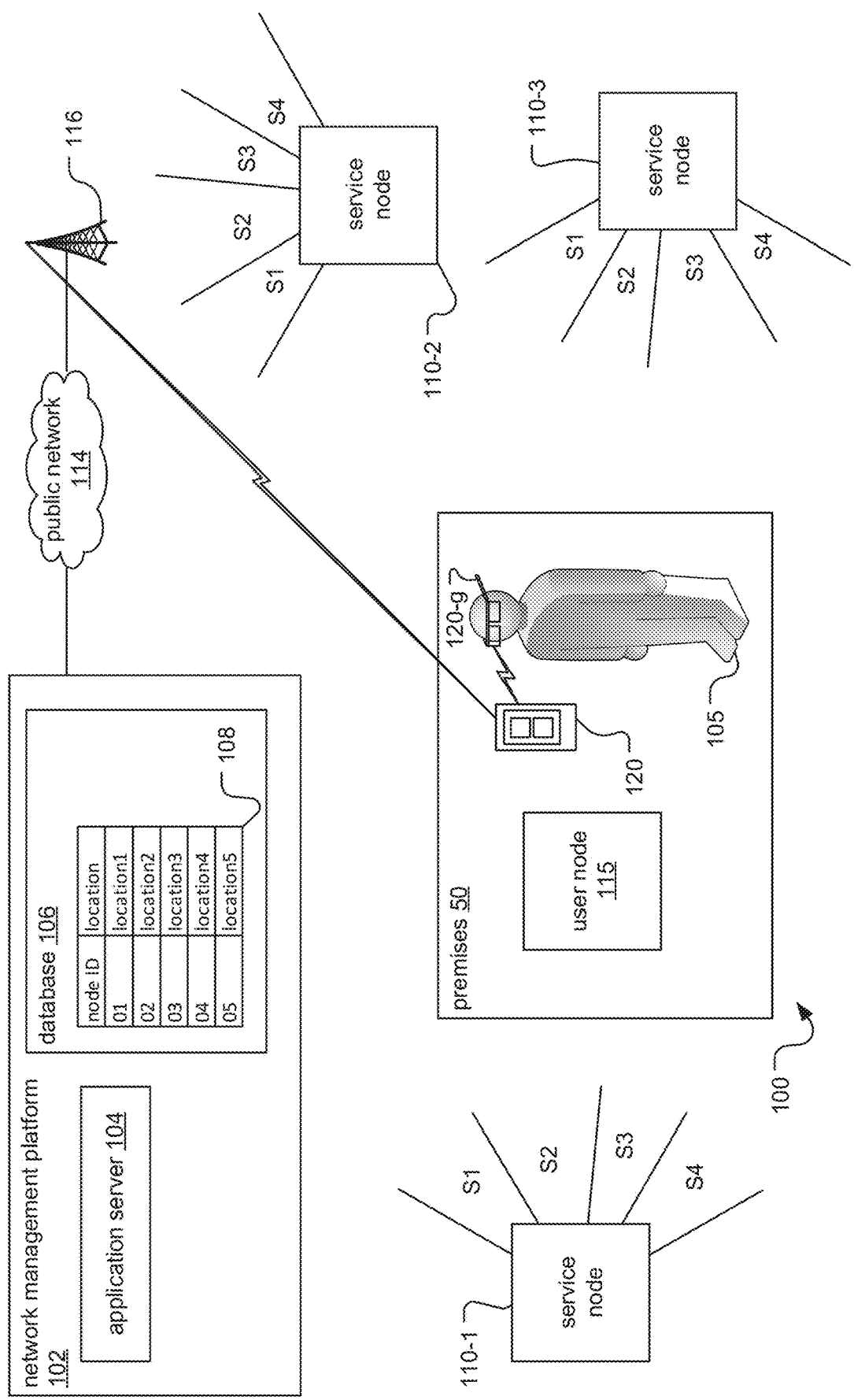
FIG. 1C is a schematic diagram of the fixed wireless data network according to another embodiment in which the AR glasses operate in conjunction with a separate mobile computing device.

FIG. 1C is a diagram of the fixed wireless data network 100 according to yet another embodiment of the invention. The system is similar to that described with respect to FIG. 1B. Now, however, the smart glasses 120-g wirelessly communicates with the smartphone mobile computing device 120 through a wired or wireless communication link such as a Bluetooth link. In this embodiment, the smartphone executes the mobile application 124 and connects to the public network 114, while the smart glasses 120-g receive and display data fed to it by the smartphone.

Figure 2:
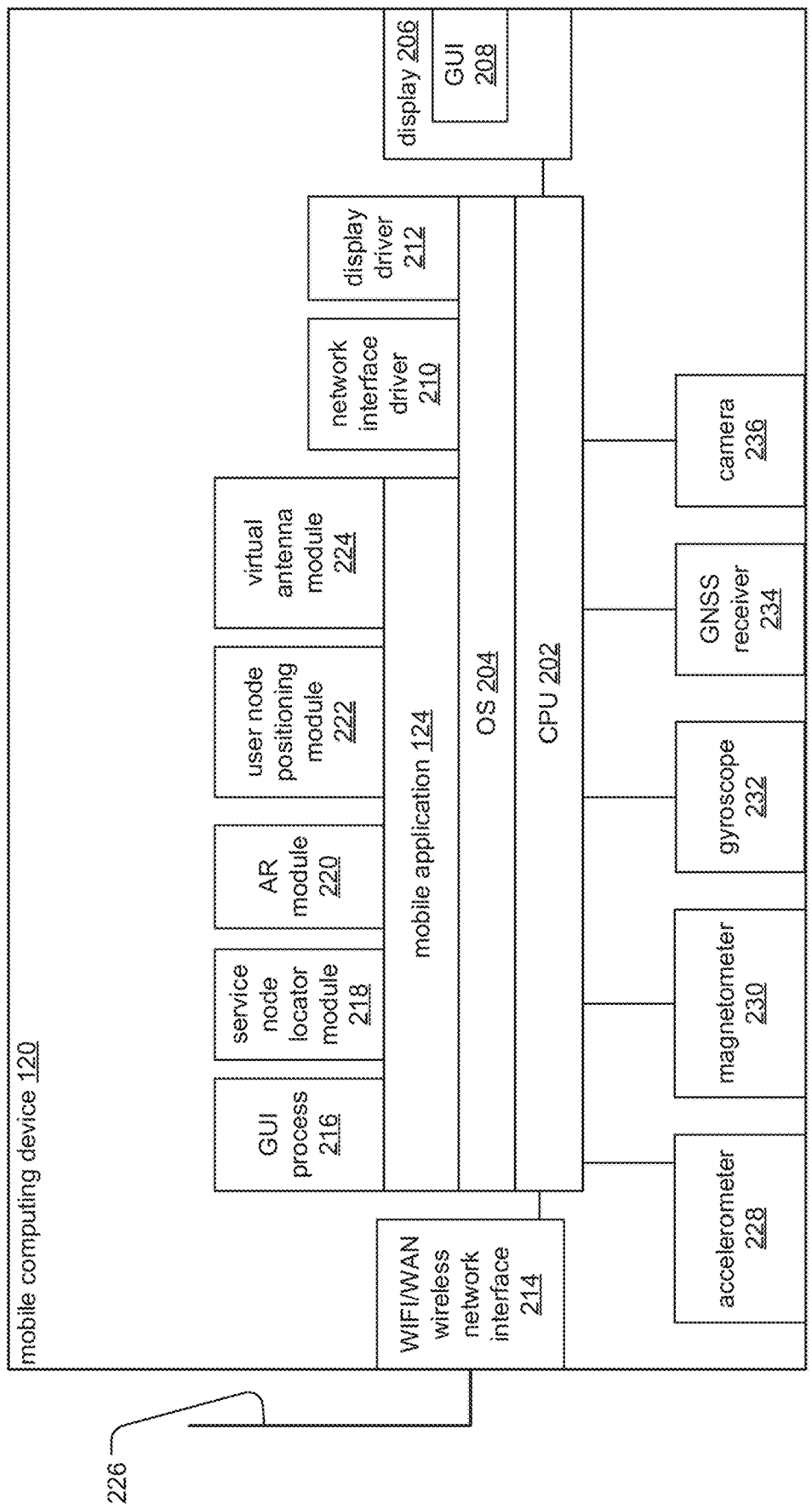
FIG. 2 is a schematic diagram of the mobile computing device showing its component and processes of the mobile application executing on the operating system of its central processing unit.

FIG. 2 is a schematic diagram of the mobile computing device 120, which can be the smart phone or the smart glasses 120-g. The device includes a CPU 202, a one or more displays 206, an accelerometer 228, a magnetometer 230, a gyroscope 232, a global navigation satellite system (GNSS) receiver 216, a camera 236, a WiFi/WAN wireless network interface 214, and one or more antennas 226.

The CPU 212 executes firmware/operating system instructions and sends instructions and data to and receives data from the wireless network interface 214, the different sensors 228, 230, 232, the GNSS receiver 234, and the display 206. Executing on typically an operating system 204 of the CPU 202 are a mobile application 124, a network interface driver 210, which directs the functionality of the WiFi/WAN wireless network interface 214, and a display driver 212, which directs the functionality of the display 206, which, in examples, is a touchscreen display of a smart phone and/or a heads-up display of smart glasses 120-g, among other examples.

In general, the sensors 228, 230, 232, 234 detect movement of the mobile computing device 120 and generate sensor data. More specifically, the accelerometer measures the acceleration of the mobile computing device 120, the magnetometer 230 measures the rotation and orientation of the mobile computing device 120 with respect to an ambient magnetic field, and the gyroscope 232 measures the angular velocity of the mobile computing device 120.

The GNSS receiver 234 receives positioning signals from GNSS satellites (such as GPS satellites) and sends positioning signals to the CPU 202, which uses them to generate location information, which is information about the current location of the mobile computing device 120.

The camera 236 captures images of the area surrounding the mobile computing device 120 (within the camera's 236 field of view) and generates image data depicting the surrounding area.

In general, the wireless network interface 214 sends and receives information between the mobile computing device 120 and the application server 104 via the antenna 226 through a wireless communication link to the WAN/LAN access point 116.

The mobile application 124 includes a graphical user interface (GUI) process 216, a service node locator module 218, an augmented reality (AR) module 220, a user node positioning module 222, and a virtual antenna module 224. In general, the mobile application presents the GUI 208 via the display 206 and facilitates the installation of the user node 115 using position information for the service nodes 110.

In general, the GUI process 216 renders a GUI 208 on the display 206. The GUI 208 includes a series of screens or views for displaying information and receiving input from the user 105, for example, by detecting contact between the user 105 and the touchscreen display 206 in certain regions of the touchscreen display 206. The GUI process 216 generates graphical elements (such as icons, virtual buttons, menus, textual information) to be displayed via the GUI 208 and receives user input indicating selections of options represented by the graphical elements of the GUI 208.

More specifically, the GUI process 216 receives captured image data depicting the surrounding area from the camera 236. The GUI process 216 also receives icon position information indicating positions for graphical elements to be displayed with respect to features of the surrounding area or orientations of the user 105 with respect to the surrounding area, node information, antenna type information (for a user node 115 to be installed), and recommendation information. In one example, the GUI process 216 displays the captured image data itself (e.g. by rendering the image data on a touchscreen display 206 of a smart phone) along with graphical elements representing service nodes 110 or user nodes 115 overlaid on the captured image data in different positions with respect to regions of the image data corresponding to positions of the service nodes based on the icon position information, with visual characteristics based on the node information, antenna type information and/or the recommendation information. In another example (e.g. using the smart glasses 120-g), the GUI process 216 superimposes the graphical elements into the field of view of the user 105 in different positions with respect to visible portions of the surrounding area in the field of view of the user 105. The GUI process 216 also receives input indicating changes in the position of the graphical elements, such as rotation, and updates the visual characteristics of the graphical elements based on the input. Finally, the GUI process 216 generates antenna snapshots, which are still images combining the captured image data depicting the surrounding area and the overlaid graphical elements and sends the antenna snapshots to be stored in the database 106.

The service node locator module 218 generates location information for the mobile computing device 120, indicating the current location of the mobile computing device 120 based on data from the GNSS receiver 234 and retrieves node information for nearby service nodes 110 based on the location information for the mobile computing device 120 by sending the location information to the application server 104, which retrieves the node information from the database 106. Based on the node information for the nearby service nodes 110, the service node locator module 218 generates relative position information (e.g. distance, direction, elevation) for the nearby service nodes 110 with respect to the current location of the mobile computing device 120.

The user node positioning module 222 generates recommendation information, which include recommendations for installing the user node 115, such as a recommended service node 110 to connect the user node 115 to or a recommended height of installation of the user node 115, among other examples. The recommendation information is generated based on node information, relative position information for nearby service nodes 110 and, for example, predetermined rules.

The AR module 220 generates icon position information for the nearby service nodes 110 or for the user node 115 to be installed. The icon position information indicates positions of the graphical elements representing the service nodes 110 or user node 115 with respect to the captured image data itself depicting the surrounding area or with respect to the field of view of the user 105. The icon position information is generated based on relative position information for nearby service nodes 110 and geometric information about the mobile computing device 120 and the surrounding area. In general, the geometric information is generated from processing the image data depicting the surrounding area as well as sensor data generated by sensors of the mobile computing device 120. This geometric information can include position information for recognized features of the surrounding area, orientation information for the mobile computing device 120, and size information, among other examples. The orientation information, which indicates the position and/or angular orientation of the mobile computing device 120 with respect to the surrounding area is in turn based on sensor data such as that received from the accelerometer 228, magnetometer 230, and gyroscope 232. Other types of sensors can also be used to generate sensor data on which the geometric information is based, including barometers, structured-light 3D scanners, and range imaging cameras, among other examples.

The virtual antenna module 224 generates position information for a virtual antenna, which is a graphical element specifically representing the user node 115 to be installed. The position information for the virtual antenna is based on the current location (for example, based on GNSS receiver data) and geometric information for the mobile computing device 120 and the surrounding area.

In one embodiment, the GUI 208 is rendered on a display 206 of the smart glasses 120-g exclusively or in addition to the touchscreen display 206 (e.g. of a smart phone), as previously described with respect to FIGS. 1B and 1C. The display 206 of the smart glasses 120-g includes an optical head-mounted display, a transparent heads-up display and/or AR overlay technology, capable of reflecting projected digital images as well as allowing the user 105 to see through the lenses. For example, the smart glasses 120-g include transparent lenses through which the user 105 directly views the surrounding area, and the display 206 includes a projection system for projecting information onto the lenses and into a visual field of the user 105. The smart glasses 120-g also include one or more cameras 236, and the image data captured by the camera 236 corresponds with and roughly depicts the surrounding area within a natural field of view of the user 105 (e.g. the same area visible through the transparent lenses of the glasses). Portions of the GUI 208 are projected onto the lenses of the glasses in different positions corresponding to visible features of the surrounding area, based on the image data captured by the camera 236, or based on orientation information for the smart glasses 120-g. More specifically, the GUI process 216 projects the graphical elements onto the lenses of the smart glasses 120-g via the projection system of the display 206 such that the graphical elements are overlaid on the natural field of view of the user 105 in different positions based on the icon position information generated by the AR module 220. One or more sensors, including the accelerometer 228, magnetometer 230, gyroscope 232, and/or GNSS receiver 234 are incorporated into the smart glasses 120-g, for example, to detect the movement and orientation of the user 105 wearing the smart glasses 120-g.

In one example, the smart glasses 120-g incorporating the display 206 work in conjunction with a separate mobile computing device 120, as previously described with respect to FIG. 1C. For example, the sensors 228, 230, 232, 234 and camera 236 on the glasses generate the sensor data and image data, which are sent to the smartphone mobile computing device 120 to be processed by the GUI process 216, AR module 220 and virtual antenna module 224 executing on the CPU 202 of the smartphone mobile computing device 120. The smartphone feeds the icon position information to the smart glasses 120-g along with any other information necessary for projecting the GUI 208 onto the lenses.

In another example, the entirety of the mobile computing device 120, including the components illustrated in FIG. 2, are integrated into the smart glasses 120-g to form a single physical unit, as depicted in FIG. 1B.

Figure 3:
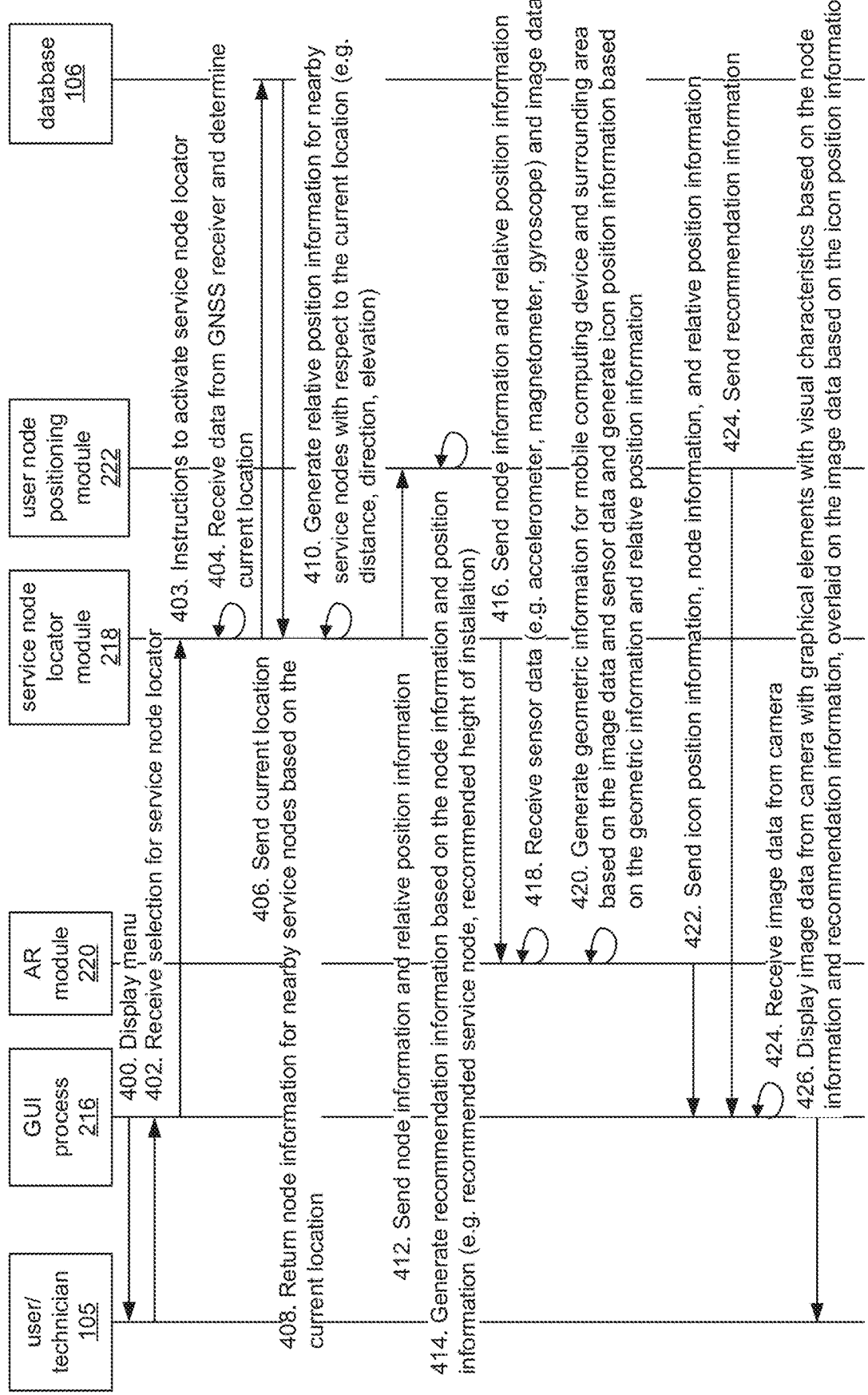
FIG. 3 is a sequence diagram illustrating the process by which the mobile application facilitates the installation of user nodes according to one embodiment of the current invention.

FIG. 3 is a sequence diagram illustrating the process by which the mobile application 124 facilitates the installation of user nodes 115 in the fixed wireless data network 100 according to one embodiment of the current invention.

In step 400, the GUI process 216 displays a menu for the user 105 and receives a selection for the service node 110 locator feature of the mobile application 124 via the GUI 208 rendered on the display 206 in step 402.

In step 403, the GUI process 216 sends instructions to the service node locator module 218 to activate.

In step 404, the service node locator module 218 receives data from the GNSS receiver 234 and generates location information for the mobile computing device 120 indicating the current location of the mobile computing device 120. In step 406, the service node locator module 218 sends the location information to the database 106 via the application server 104, and the database 106 returns node information in step 408 for nearby service nodes, including location information for the service nodes 110, based on the location information for the mobile computing device 120.

In step 410, the service node locator module 218 generates relative position information (e.g. distance, direction, elevation) for nearby service nodes 110 with respect to the current location of the mobile computing device 120.

In step 412, the service node locator module 218 sends the node information and the relative position information to the user node positioning module 222, which, in step 414, generates recommendation information based on the node information and the relative position information. Examples of the recommendation include a recommended service node 110 to connect to (and thus to physically orient the user node 115 toward) and a recommended height of installation for the user node 115.

In step 416, the service node locator module 218 also sends the node information and relative position information for the nearby service nodes 110 to the AR module 220. The AR module 220 retrieves the sensor data from the accelerometer 228, magnetometer 230 and gyroscope 232 and image data from the camera in step 418. In step 420, the AR module 220 generates geometric information for the mobile computing device 120 based on the sensor data and the image data and then generates icon position information for the nearby service nodes 110 based on the geometric information and the relative position information. In step 422, the AR module 220 sends the icon position information, node information and relative position information for the nearby service nodes 110 to the GUI process 216.

In step 424, the GUI process 216 also receives the recommendation information from the user node positioning module 222, and in step 424, the GUI process 216 receives captured image data from the camera 236 depicting the surrounding area.

In step 426, the GUI process 216 displays the captured image data depicting the surrounding area with graphical elements representing the nearby service nodes 110 overlaid on the image data in different positions with respect to the image data based on the icon position information and with visual characteristics based on the node information and the recommendation information.

At this point, the user 105 uses the mobile computing device 120 to view the surrounding area in several different directions in order to decide, based on the positions and visual characteristics of the graphical elements representing the service nodes 110, where to install the user node 115. In this way, the mobile application facilitates the installation of the user node 115.

Figure 4:
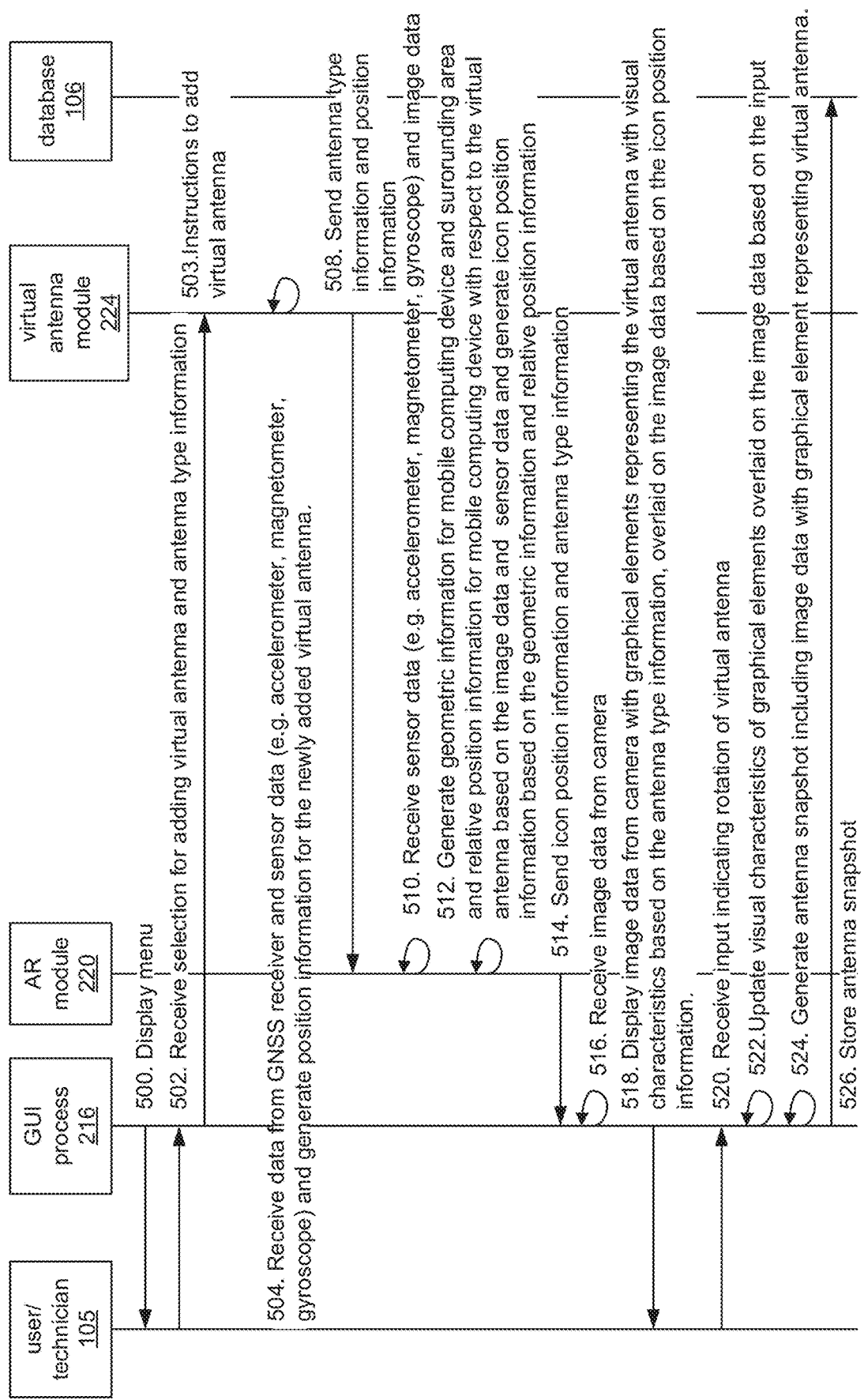
FIG. 4 is a sequence diagram illustrating the process by which the mobile application facilitates the installation of user nodes according to another embodiment of the current invention.

FIG. 4 is a sequence diagram illustrating the process by which the mobile application 124 facilitates the installation of user nodes 115 in the fixed wireless data network 100 according to another embodiment of the current invention.

In step 500, the GUI process 216 displays a menu for the user 105 and receives a selection for the virtual antenna feature of the mobile application 124 in step 502 as well as input indicating antenna type information for the user node 115 to be installed via the GUI 208 rendered on the display 206.

In step 503, the GUI process 216 sends instructions to the virtual antenna module 224 to generate a new virtual antenna based on the antenna type information.

In step 504, the virtual antenna module 224 retrieves GNSS receiver data and sensor data from the accelerometer 228, magnetometer 230 and gyroscope 232 in order to generate position information for the newly generated virtual antenna. In one example, the virtual antenna module 224 generates position information indicating the current location of the mobile computing device 120 as the position of the virtual antenna. In step 508, the virtual antenna module 224 sends the antenna type information and position information for the virtual antenna to the AR module 220.

In step 510, the AR module 220 retrieves sensor data from the accelerometer 228, magnetometer 230 and gyroscope 232 and image data from the camera. In step 512, the AR module 220 generates geometric information for the mobile computing device 120 and relative position information for the mobile computing device 120 with respect to the virtual antenna, based on the sensor data and image data. The AR module 220 then generates icon position information based on the geometric information and relative position information. In step 514, the AR module 220 sends the icon position information and antenna type information for the virtual antenna to the GUI process 216.

The GUI process 216, in step 516, retrieves captured image data depicting the surrounding area from the camera 236. In step 518, the GUI process 216 displays the captured image data with a graphical element representing the virtual antenna with visual characteristics based on the antenna type information. The graphical element representing the virtual antenna is overlaid on the image data in different positions with respect to the image data based on the icon position information.

In step 520, the GUI process 216 receives input via the GUI 208 and the touchscreen display 206 indicating movement (for example, rotation) of the virtual antenna.

In step 522, the GUI process 216 updates the visual characteristics of the graphical element representing the virtual antenna based on the input received in step 520.

In step 524, the GUI process generates an antenna snapshot, which includes the captured image data depicting the surrounding area combined with the graphical element overlaid on the image data representing the virtual antenna. In step 526, the GUI process 216 stores the antenna snapshot in the database 106.

Figure 5:
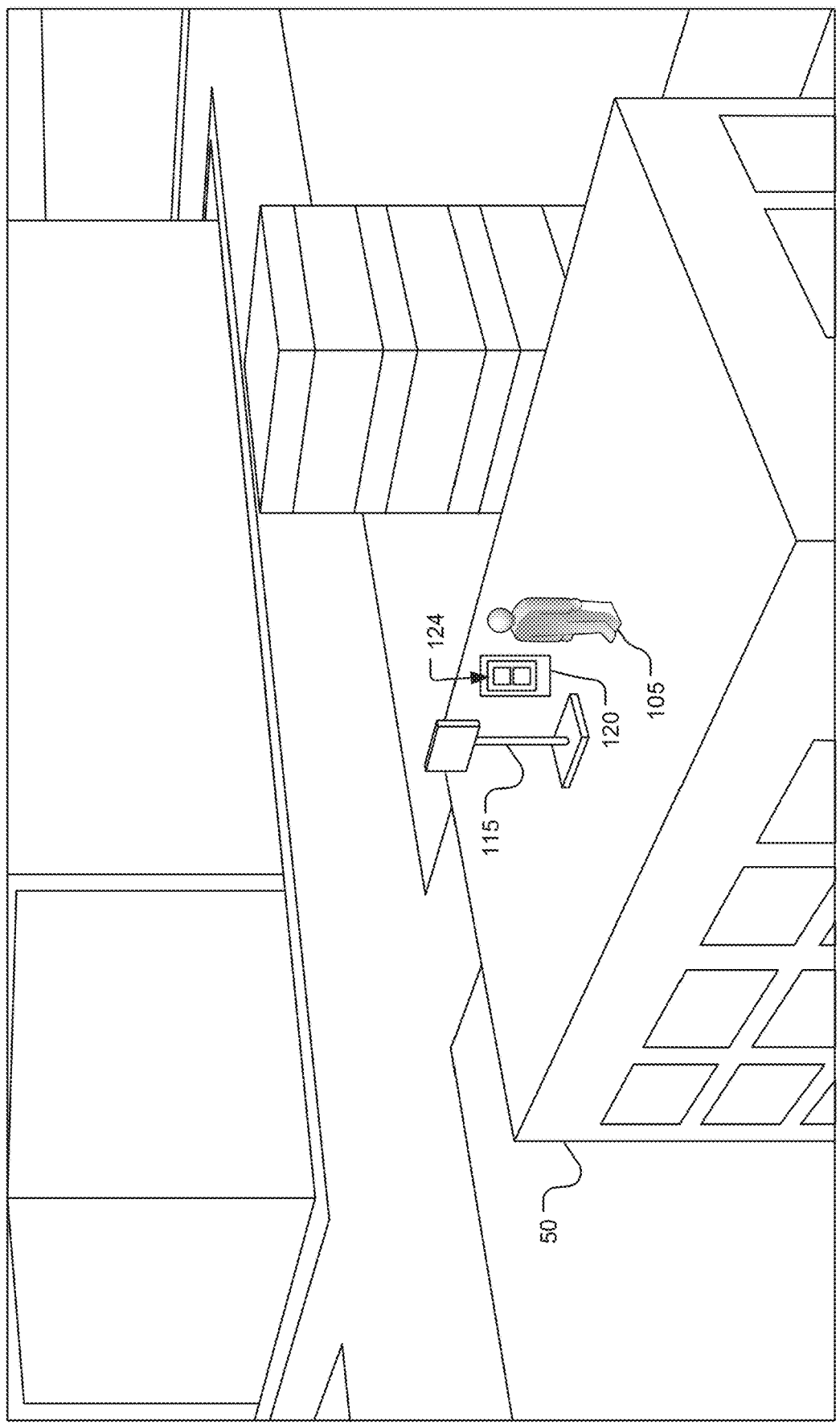
FIG. 5 is a perspective view of an exemplary installation of a user node facilitated by the mobile application, in which the premises is an apartment building.

FIG. 5 is a perspective view of an exemplary installation of a user node 115 facilitated by the mobile application 124, in which the premises 50 is an apartment building. In the illustrated example, the user 105 is a technician installing a user node 115 on the roof of the apartment building. The technician 105 uses the mobile computing device 120 to scan the horizon to locate service nodes 110 in the area surrounding the apartment building 50. Using the GPS coordinates of the mobile computing device 120 and the service nodes 110, the mobile application 124 presents to the technician 105 a graphical representation of where nearby service nodes 110 are located (their position relative to the user 105, including distance and altitude), which in turn facilitates the process of determining an optimal location for the user node 115 as well as an optimal orientation (toward a particular service node 110).

FIGS. 6-16 and 18-22 are illustrations of exemplary screens or views of the GUI 208. In general, the screens/views include graphical elements such as icons, virtual buttons, textual information, and menus for presenting information and receiving input from the user 105. Selection of the virtual buttons, for example, is indicated by the touchscreen display 206 detecting contact (for example, from the user's 105 finger) in regions of the touchscreen display 206 containing the virtual buttons. Other input is indicated by the touchscreen display 206 detecting other gestures such as dragging or swiping.

In one example, the illustrations of FIGS. 6-16 and 18-22 depict screens that are rendered by the GUI process 216 on the touchscreen display 206 of the mobile computing device 120 during the installation process. In this case, in general, the screens include captured image data depicting the surrounding environment in the background, and the GUI 208 includes the graphical elements overlaid on the background image data.

In another example, the illustrations of FIGS. 6-16 and 18-22 depict different views through lenses of the smart glasses 120-*g*. Here, the field of view of the user 105 is analogous to the background image data rendered on the touchscreen display 206 in the previous example. Instead of, or in addition to, viewing the depiction of the surrounding area rendered on the display 206, the user 105 directly views the surrounding environment through the lenses of the smart glasses 120-*g*, and the GUI 208 includes the graphical elements superimposed or projected into the field of view of the user 105 by the display 206.

Figure 6:
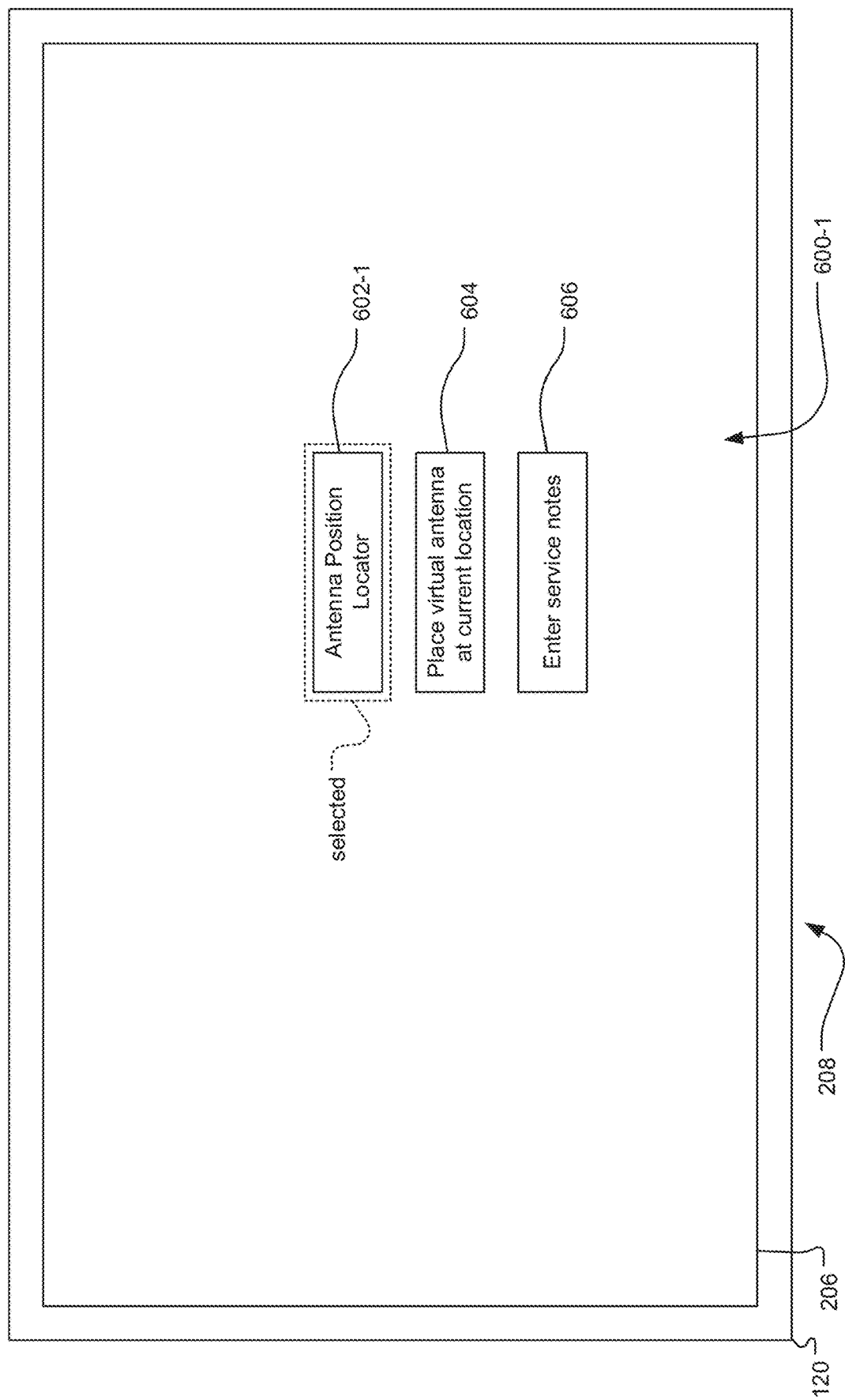
FIG. 6 is an illustration of an exemplary menu screen of the graphical user interface.

FIG. 6 is an illustration of an exemplary menu screen 600-1 showing the selection of the antenna position locator feature. The menu screen 600-1 includes an antenna position locator button 602-1, a place virtual antenna button 604 and an enter service notes 606 button. In the illustrated example, the antenna position locator button 602-1 is selected.

Figure 7:
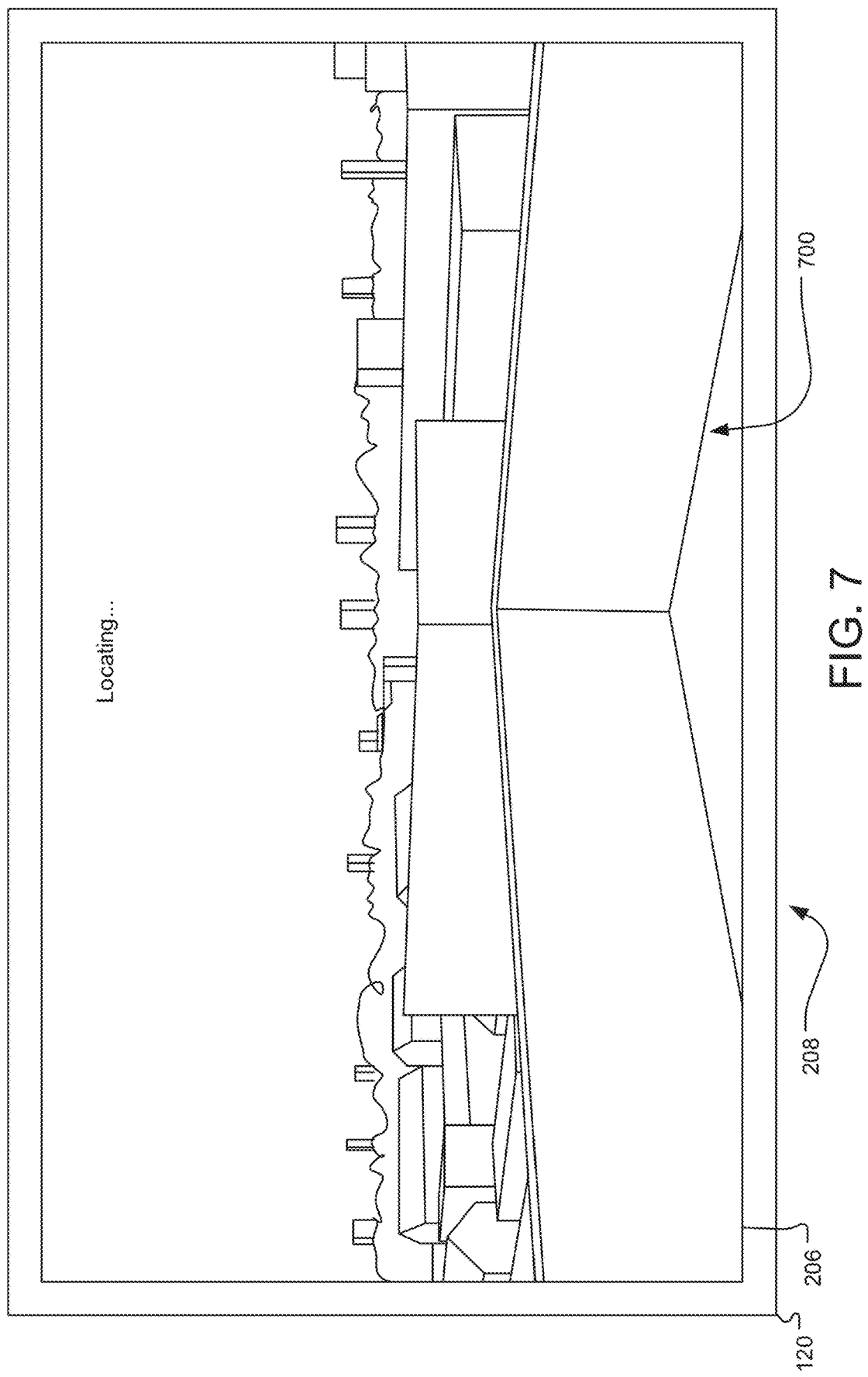
FIG. 7 is an illustration of an exemplary locating screen.

FIG. 7 is an illustration of an exemplary locating screen 700, which is displayed when the position locator button 602 is selected on the menu screen 600. The locating screen 700 includes a background that spans the entire area of the screen and includes real time image data captured by the camera 236 depicting the area surrounding the mobile computing device 120 within a current field of view of the camera 236. Overlaid on the image data background is textual information indicating that the mobile application 124 is in the process of locating nearby service nodes 110. In the illustrated example, the captured image data depicts a corner of the roof of the apartment building 50 as well as the surrounding area that is visible from the current location of the mobile computing device 120, including rooftops of other buildings and trees.

Figure 8:
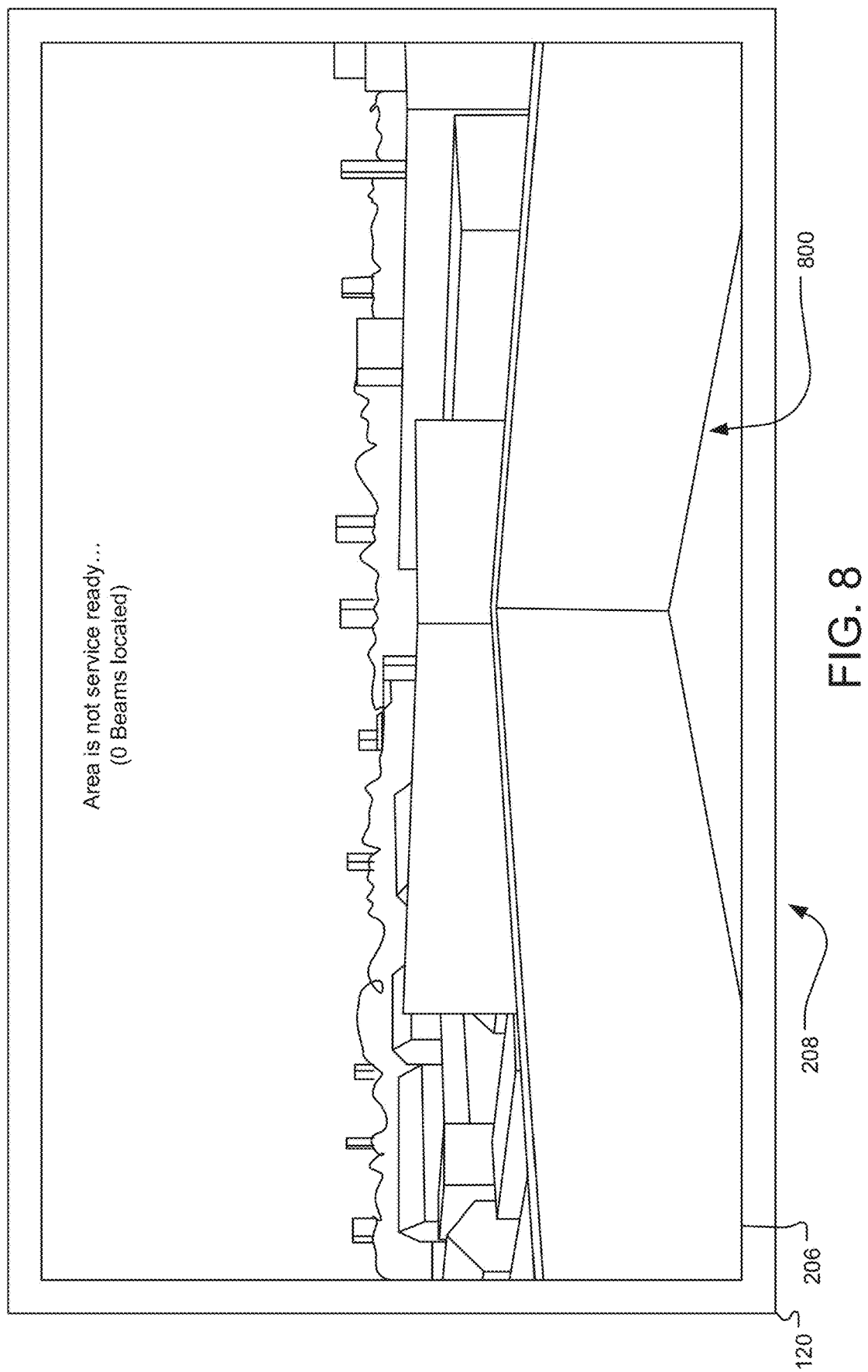
FIG. 8 is an illustration of an exemplary results screen, which is displayed when the mobile application is unsuccessful in locating nearby service nodes.

FIG. 8 is an illustration of an exemplary results screen 800, which is displayed when the mobile application 124 completes the process of locating nearby service nodes 110. As before, the results screen 800 includes a background that spans the entire area of the screen and includes real time captured image data depicting the area surrounding the mobile computing device 120. In the illustrated example, no nearby service nodes 110 have been located. As a result, overlaid on the image data background is textual information indicating that no service nodes 110 have been located and that service is not available in the area.

Figure 9:
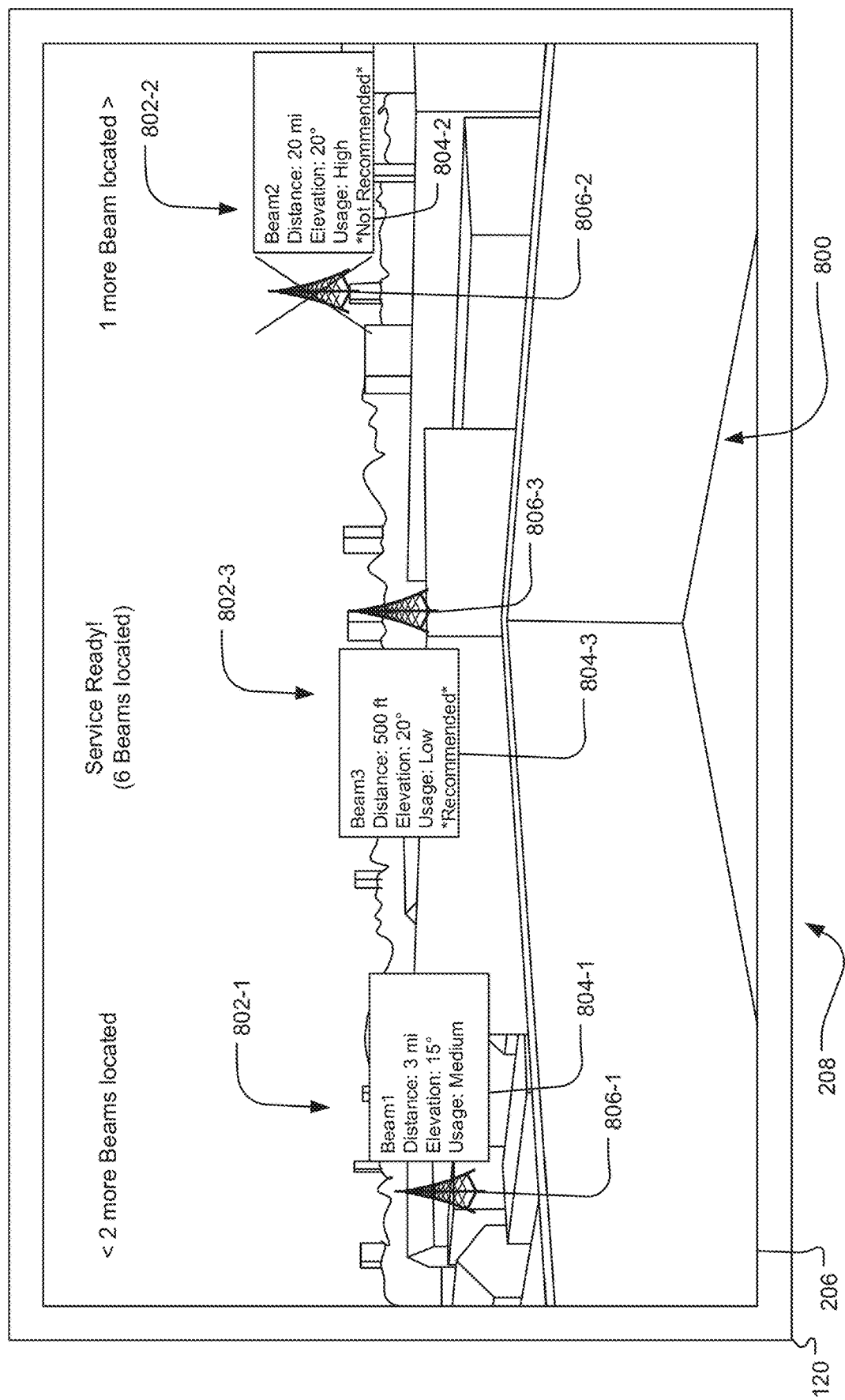
FIG. 9 is an illustration of the results screen, which is displayed when the mobile application is successful in locating nearby service nodes.

FIG. 9 is an illustration of the results screen 800, which is displayed when the mobile application 124 is successful in locating nearby service nodes 110. Here, the results screen 800 includes textual information indicating that service is available in the area and the number of service nodes 110 that were determined to be nearby, graphical elements 802 representing nearby service nodes 110, and graphical elements indicating directions, with respect to the current orientation of the mobile computing device 120, in which additional service nodes 110 that are not currently in the field of view of the camera 236 (and thus not displayed) can be found.

In general, the graphical elements 802 representing the nearby service nodes 110 include icons 806 as well as information panes 804 which include textual information. The position of the graphical elements 802 with respect to the background image data is based on the geometric information for the mobile computing device 120 and the surrounding area as well as the relative position information for the nearby service nodes 110. The visual characteristics of the icons 806 and the textual information in the information panes 804 are based on the node information and recommendation information associated with the service nodes 110 represented by the graphical elements 802.

In the illustrated example, textual information indicates that service is available in the area surrounding the premises 50 and that a total of 6 service nodes 110 have been located. Three of the service nodes 110 are represented by graphical elements 802-1, 802-2, 802-3 currently displayed. Textual information indicates that two additional service nodes 110 would become visible if the mobile computing device 120 is rotated in the counterclockwise direction (or toward the left), and one additional service node 110 would become visible if the mobile computing device 120 is rotated in the clockwise direction (or toward the right). The three graphical elements 802 are in different horizontal and vertical positions with respect to the background image data, and more particularly, the horizon depicted in the background image data, based on the different relative distances and elevations of the service nodes 110 represented by the graphical elements 802 with respect to the mobile computing device 120.

The first graphical element 802-1 includes an icon 806-1 resembling an antenna tower as well as an information pane 804-1 including textual information indicating that the associated service node 110 has a name of "Beam1", a distance of three miles from the current location of the mobile computing device, an elevation of 15 degrees, and medium usage.

The second graphical element 802-2 has similar features. However, the antenna icon 806-2 includes an X, indicating that the service node 110 is not recommended. Similarly, the textual information in the information pane 804-2 indicates that the distance of the service node 110 from the mobile computing device 120 is 20 miles, the usage level is high, and the service node 110 is not recommended.

The third graphical element 802-3 likewise has similar features to the first graphical element 802-1. However, now the textual information in the information pane 804-3 indicates that the distance of the service node 110 from the mobile computing device 120 is only 500 feet, the usage level is low, and the service node 110 is recommended.

Figure 10:
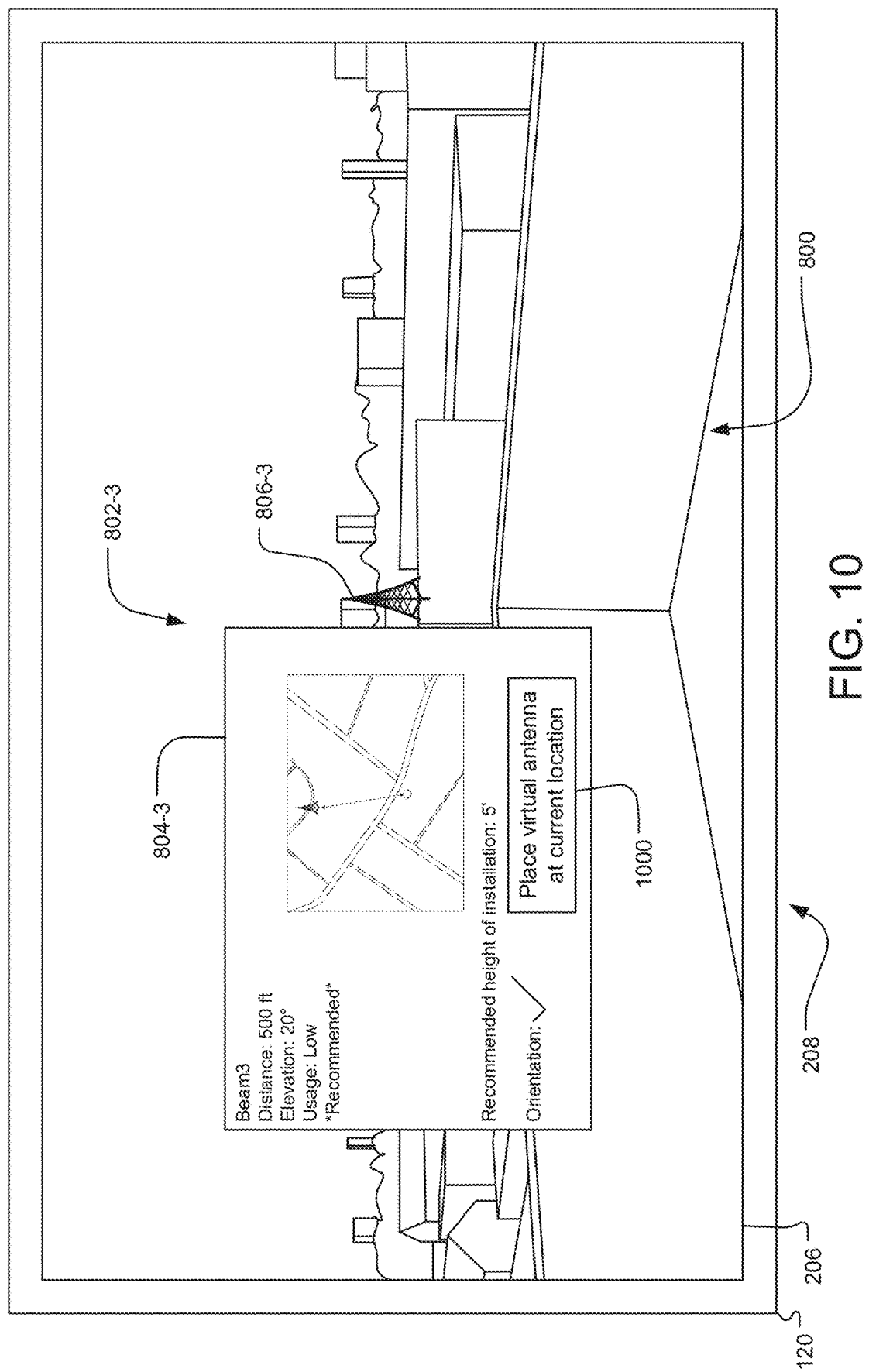
FIG. 10 is an illustration of the results screen showing a graphical element representing a service node with an expanded information pane.

FIG. 10 is an illustration of the results screen 800 showing a graphical element 802-3 with an expanded information pane 804-3, which is displayed when the graphical element 802-3 is selected. The expanded information pane 804-3 now includes additional information including textual information indicating a recommended height of installation of the user node 115, graphical and textual information indicating that the current orientation of the mobile computing device 120 is optimal, as well as an image of a map indicating the current location of the mobile computing device 120 and the location of the service node 110 represented by the graphical element 802-3. Also included is a place virtual antenna button 1000, which indicates that a virtual antenna should be placed at the current location of the mobile computing device 120.

Figure 11:
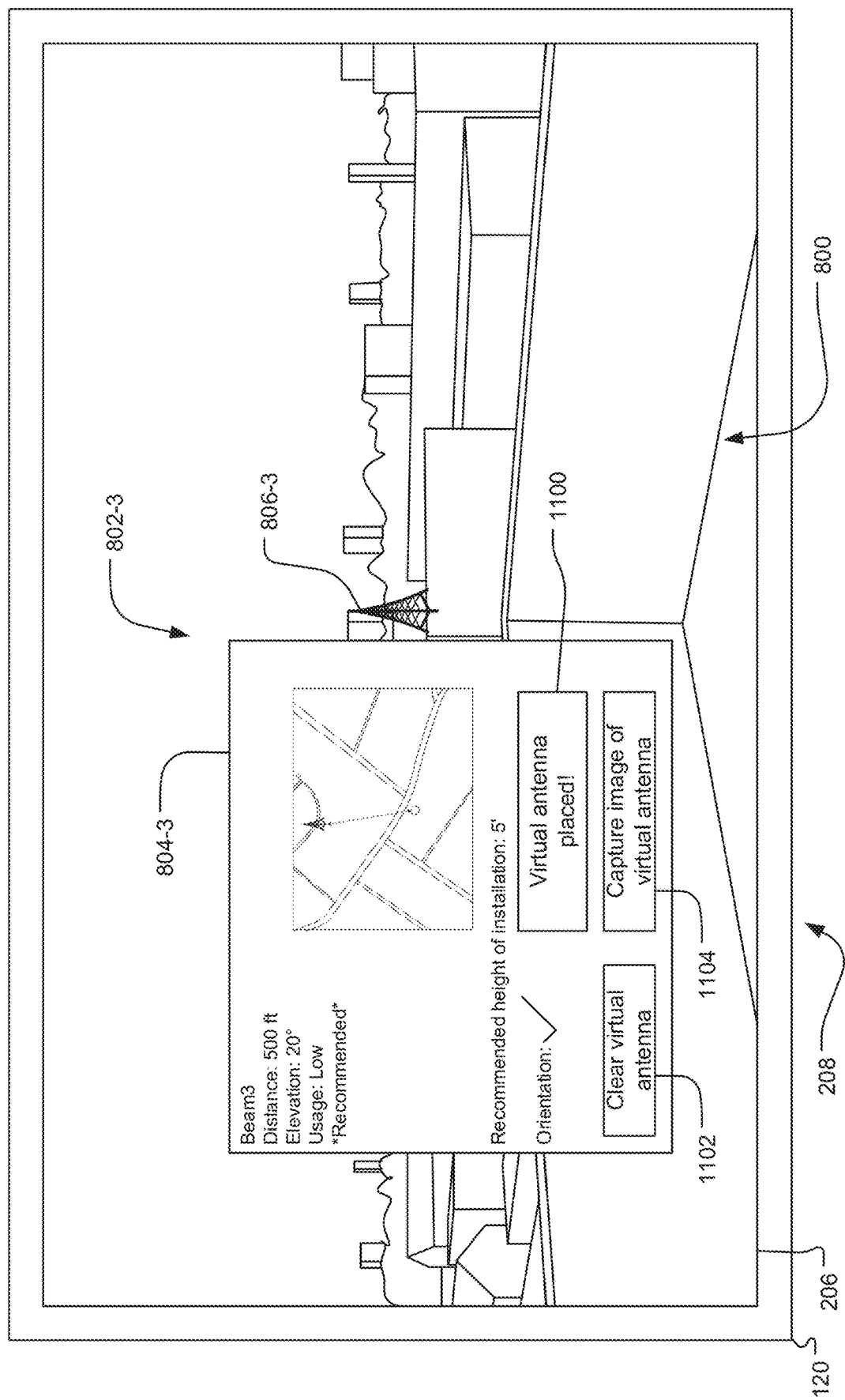
FIG. 11 is an illustration of the results screen showing a graphical element with an expanded information pane, according to an example in which a virtual antenna has been generated.

FIG. 11 is an illustration of the results screen 800 showing a graphical element 802-3 with an expanded information pane 804-3, which is displayed when the place virtual antenna button 1000 is selected. Here, instead of the place virtual antenna button 1000, a virtual antenna status indicator 1100 is included, indicating that the virtual antenna has been generated for the current location. Also included are a clear virtual antenna button 1102 and a capture image of virtual antenna button 1104.

Figure 12:
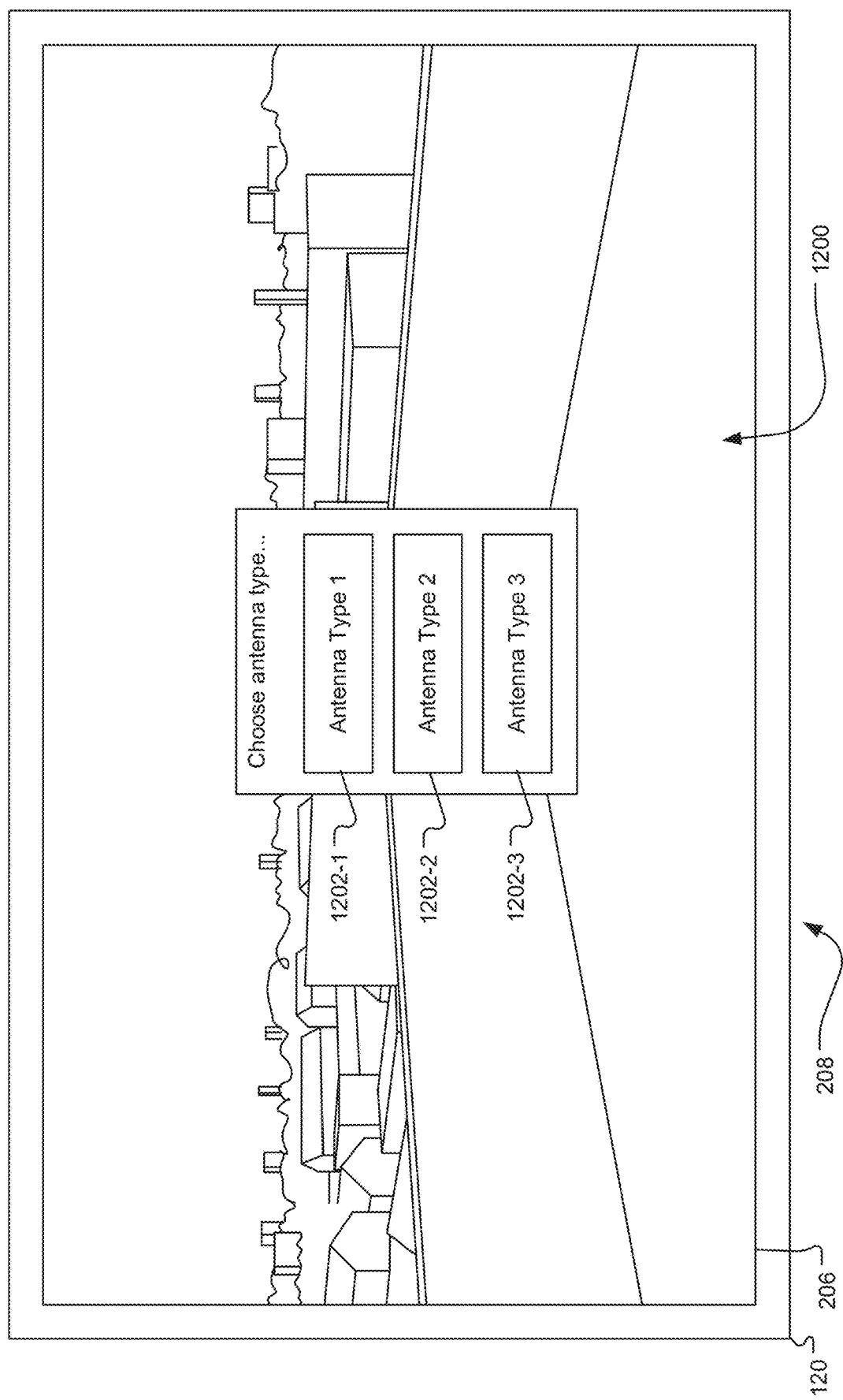
FIG. 12 is an illustration of an exemplary antenna type selection screen.

FIG. 12 is an illustration of an exemplary antenna type selection screen 1200, which is displayed when the capture image of virtual antenna button 1104 is selected on the results screen 800. In general, the antenna type selection screen 1200 prompts the user to select from a predetermined set of antenna types, which will determine the visual characteristics of the virtual antenna in the antenna snapshot. Included are three antenna type buttons 1202 indicating Antenna Type 1, Antenna Type 2, and Antenna Type 3.

Figure 13:
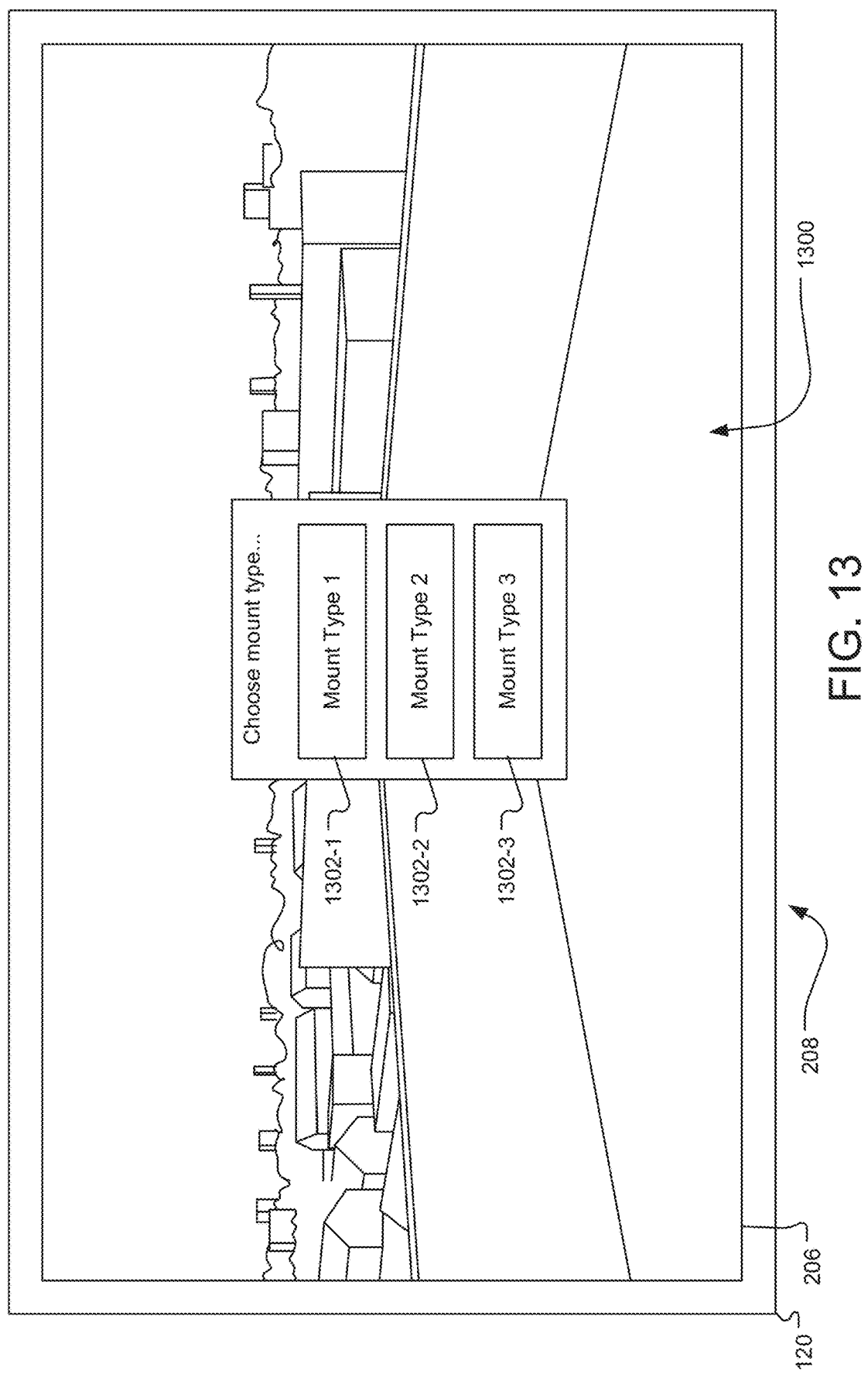
FIG. 13 is an illustration of an exemplary antenna mount type selection screen.

FIG. 13 is an illustration of an exemplary antenna mount type selection screen 1300, which is displayed when any one of the antenna type buttons 1202 is selected on the antenna type selection screen 1200. In general, the antenna mount type selection screen 1300 prompts the user to select from a predetermined set of antenna mount types, which will determine the visual characteristics of the virtual antenna in the antenna snapshot. Included are three antenna mount type buttons 1302 indicating Mount Type 1, Mount Type 2, and Mount Type 3.

Figure 14:
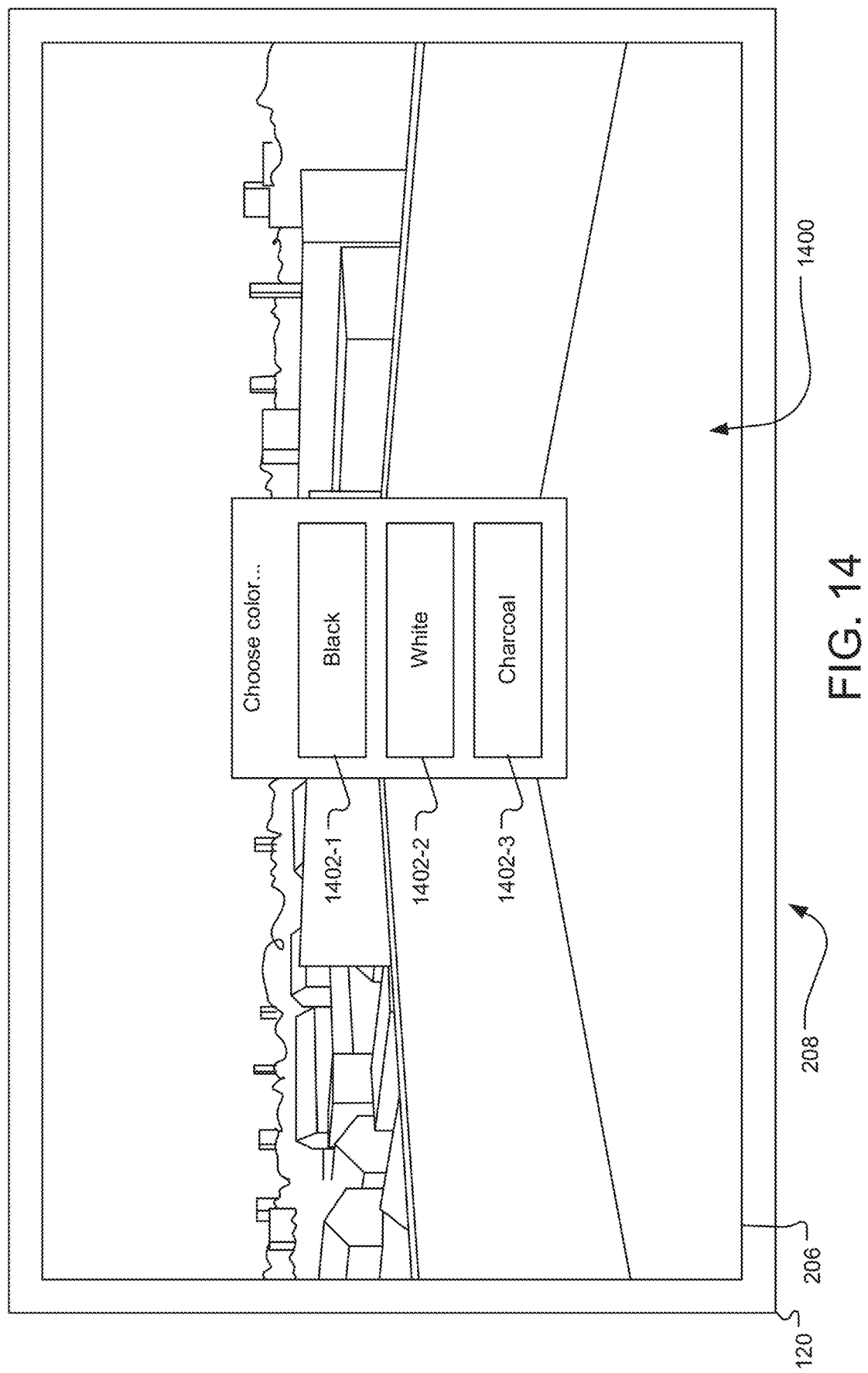
FIG. 14 is an illustration of an exemplary antenna color selection screen.

FIG. 14 is an illustration of an exemplary antenna color selection screen 1400 which is displayed when any one of the antenna mount type buttons 1302 is selected on the antenna mount type selection screen 1300. In general, the antenna color selection screen 1400 prompts the user to select from a predetermined set of antenna colors, which will determine the visual characteristics of the virtual antenna in the antenna snapshot. Included are three antenna color buttons 1402 indicating black, white, and charcoal.

Figure 15:
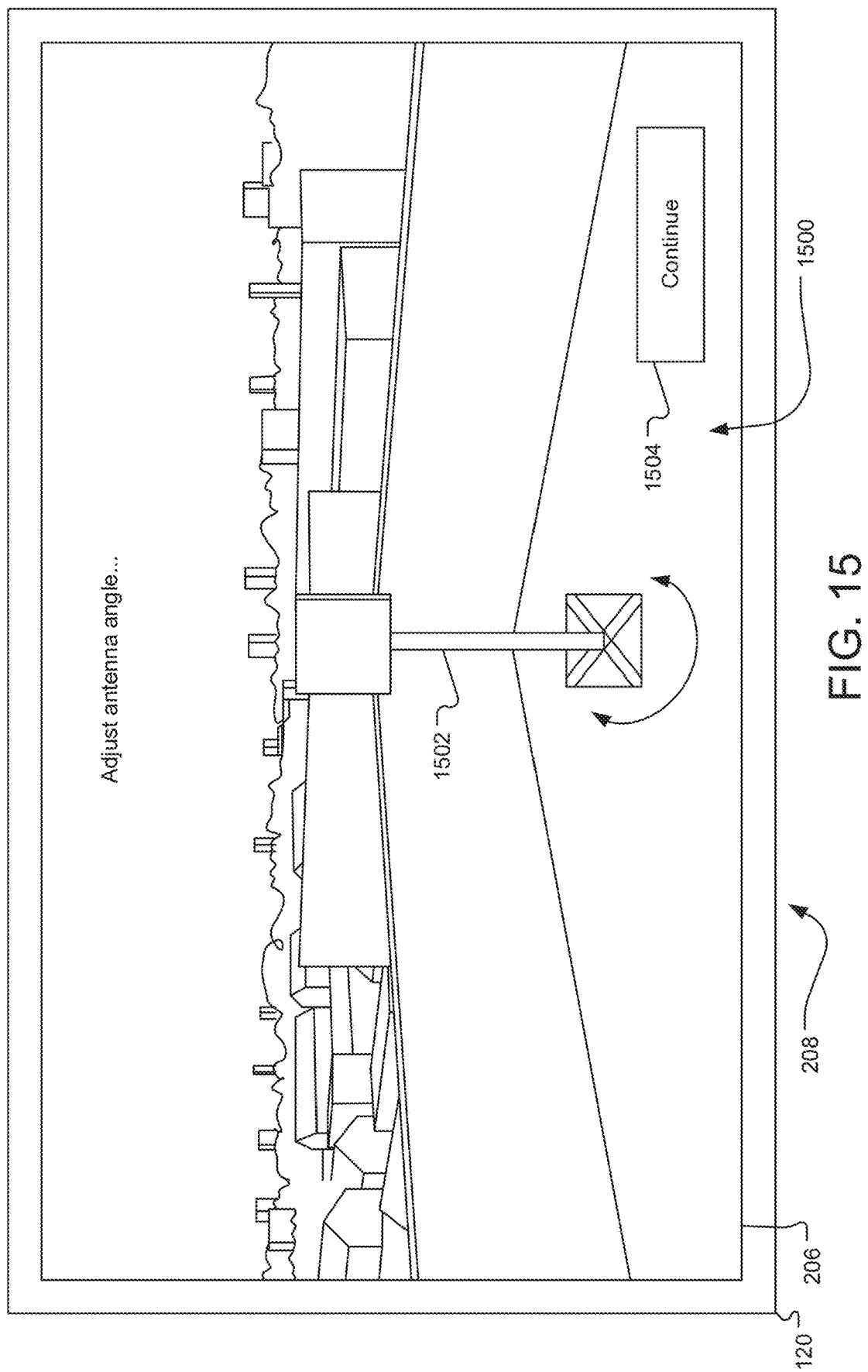
FIG. 15 is an illustration of an exemplary antenna position selection screen.

FIG. 15 is an illustration of an exemplary antenna position selection screen 1500, which is displayed when any one of the antenna color buttons 1402 is selected on the antenna color selection screen 1400. In general, the antenna position selection screen 1500 prompts the user to change the position of a virtual antenna icon 1502, which will determine the visual characteristics of the virtual antenna depicted in the antenna snapshot. In the illustrated example, an arrow indicates that the virtual antenna can be rotated clockwise or counter clockwise, for example, by the touchscreen display 206 detecting a gesture such as the user 105 dragging their finger in a circular motion in the region of the display 206 containing or in the vicinity of the virtual antenna icon 1502. The visual characteristics of the virtual antenna icon 1502 are adjusted in real time based on the input from the user 105. Also included is a continue button 1504.

Figure 16:
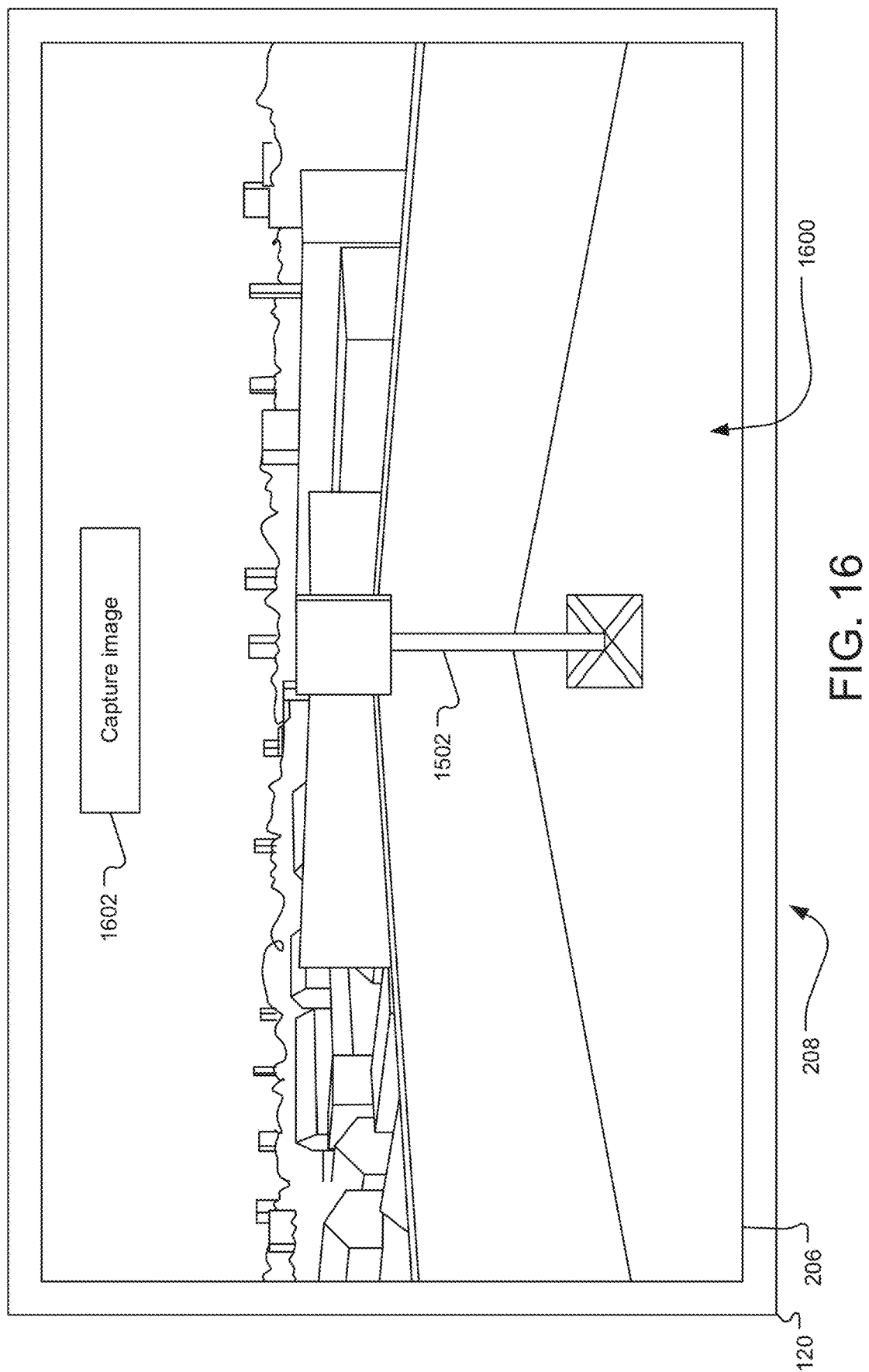
FIG. 16 is an illustration of an exemplary capture image screen.

FIG. 16 is an illustration of an exemplary capture image screen 1600, which is displayed when the continue button 1404 is selected on the antenna position selection screen 1500. In general, the capture image screen 1600 displays a representation of the antenna snapshot depicting the virtual antenna that will be stored, and the current visual characteristics and position of the virtual antenna icon 1502, based on selections made in the antenna type selection screen 1200, antenna mount type selection screen 1300, antenna color selection screen 1400, and antenna position selection screen 1500. Also included is a capture image button 1602. When the capture image button 1602 is selected, a still image combining the background image data and the virtual antenna icon 1502 will be generated and stored in the database 106.

Figure 17:
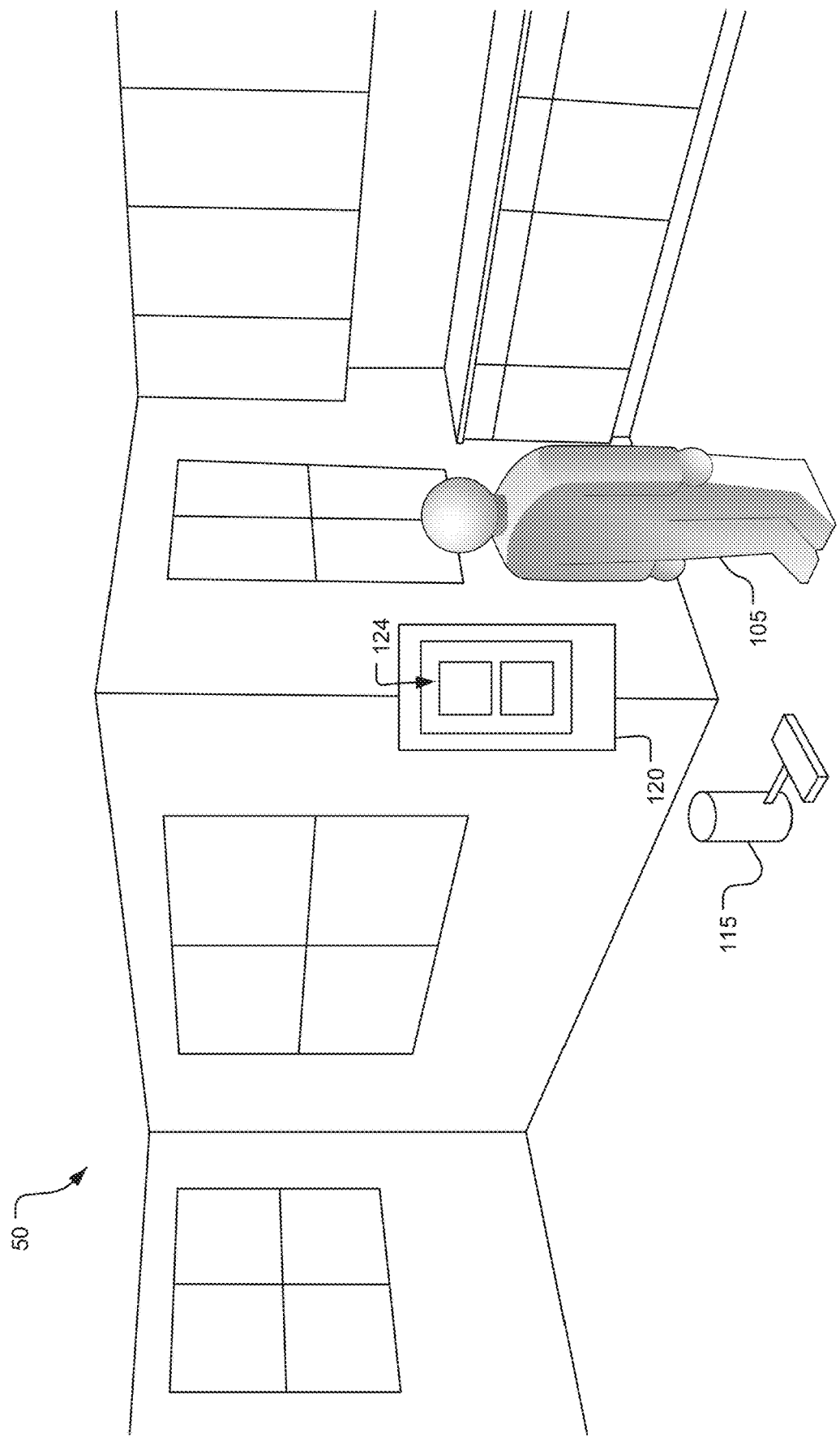
FIG. 17 is a perspective view of an exemplary installation of a user node facilitated by the mobile application executing on a mobile computing device, in which the premises is a single apartment unit.

FIG. 17 is a perspective view of an exemplary installation of a user node 115 facilitated by the mobile application 124, in which the premises 50 is a single apartment unit. In the illustrated example, the user 105 is an ISP customer 105 installing a user node 115, which is a window antenna, in their apartment. The user 105 uses the mobile computing device 120 to scan the horizon to locate service nodes 110 in the area surrounding the apartment 50. Using the GPS coordinates of the mobile computing device 120 and the service nodes 110, the mobile application 124 allows the user 105 to see a graphical representation of where nearby service nodes 110 are located (their position relative to the user 105, including distance and altitude), which in turn facilitates the process of determining an optimal location, such as a specific window or side of the home, for the user node 115 as well as an optimal orientation (toward a particular service node 110).

Figure 18:
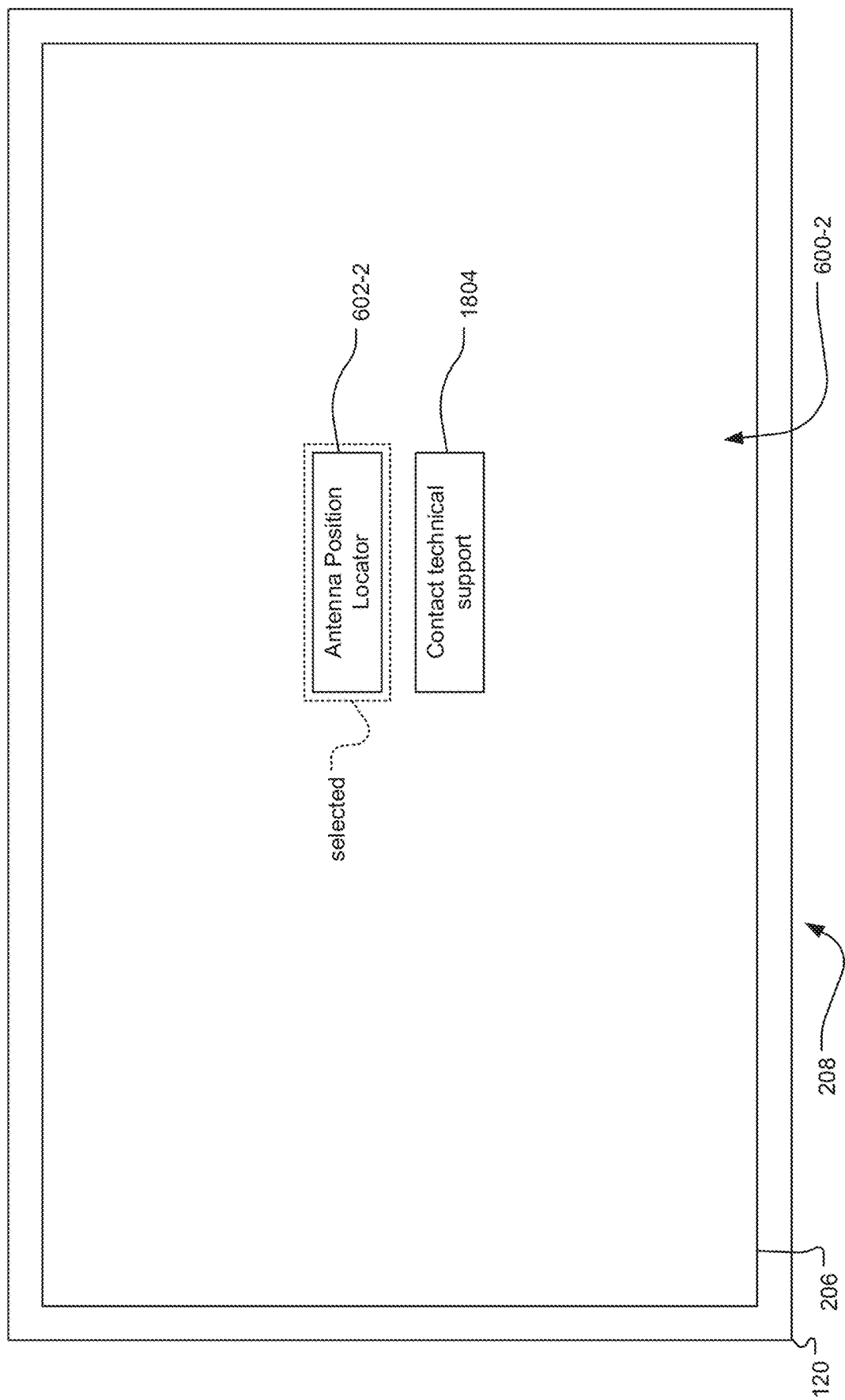
FIG. 18 is an illustration of the menu screen, according to an example in which an internet service provider customer installs the user node in an apartment unit.

FIG. 18 is an illustration of the menu screen 600-2, according to an example in which an ISP customer 105 installs the user node 115 in an apartment unit. The menu screen 600-2 includes an antenna position locator button 602-2 and a contact technical support button 1804. In the illustrated example, the antenna position locator button 602-2 is selected.

Figure 19:
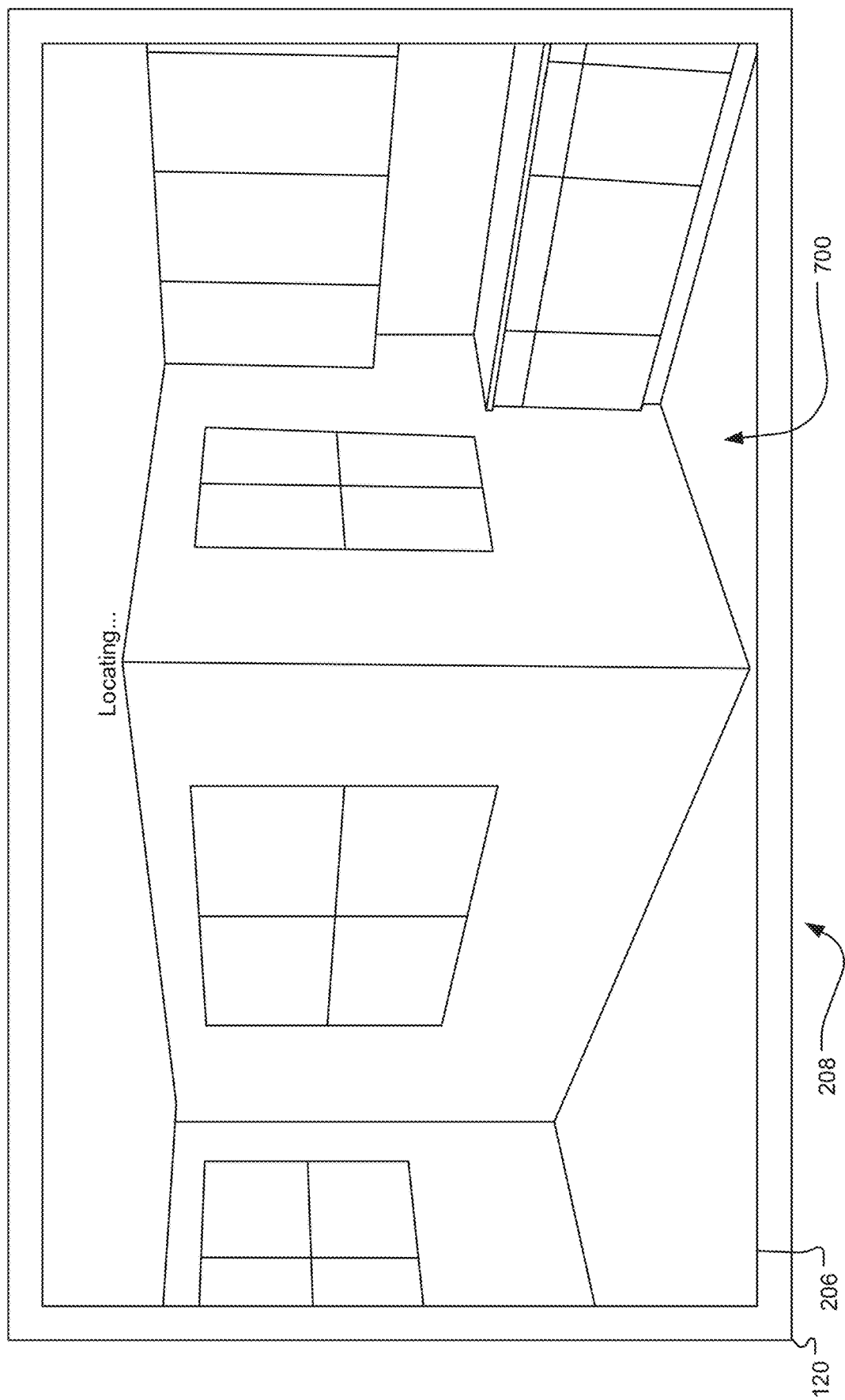
FIG. 19 is an illustration of the locating screen, according to an example in which an internet service provider customer installs the user node in an apartment unit.

FIG. 19 is an illustration of the locating screen 700, which is displayed when the antenna position locator button 602 is selected, according to an example in which an ISP customer 105 installs the user node 115 in an apartment unit. In the illustrated example, the captured image data depicts an interior of an apartment, including three different walk with windows.

Figure 20:
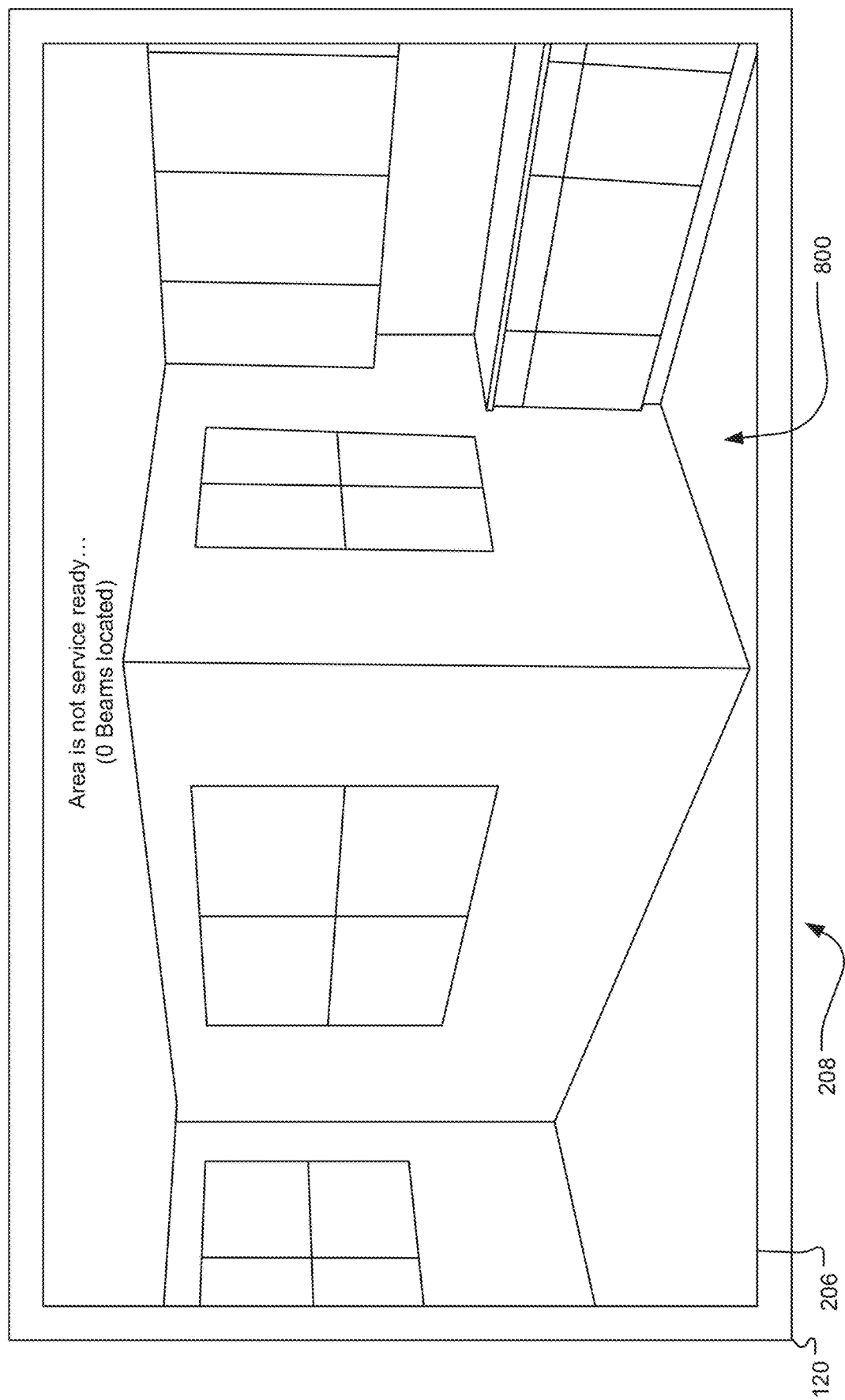
FIG. 20 is an illustration of the results screen, which is displayed when the mobile application is unsuccessful in locating nearby service nodes, according to an example in which an internet service provider customer installs the user node in an apartment unit.

FIG. 20 is an illustration of the results screen 800, which is displayed when the mobile application 124 completes the process of locating nearby service nodes 110, according to an example in which an ISP customer 105 installs the user node 115 in an apartment unit. As before, in the illustrated example, no nearby service nodes 110 have been located. As a result, overlaid on the image data background is textual information indicating that no service nodes 110 have been located and that service is not available in the area.

Figure 21:
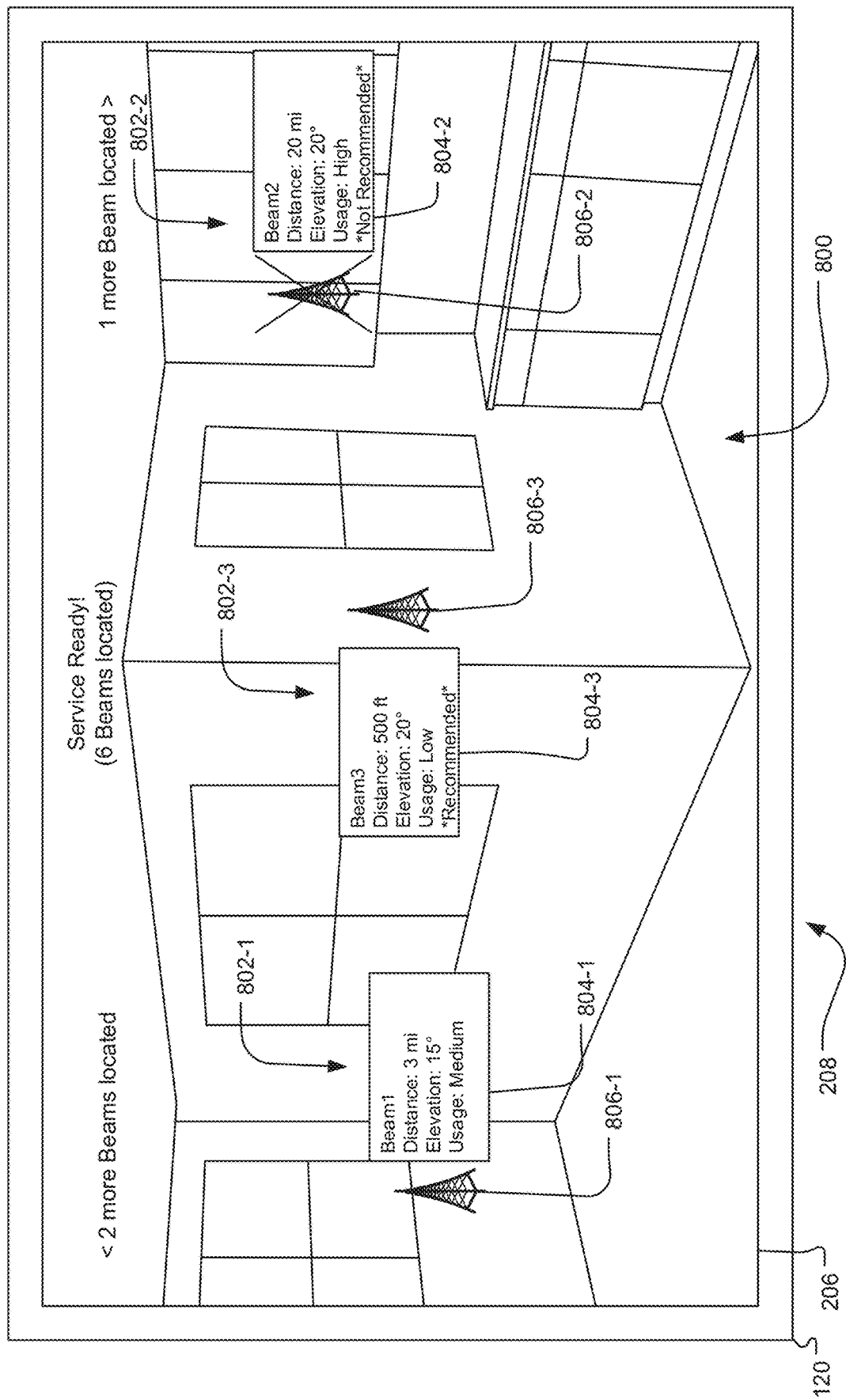
FIG. 21 is an illustration of the results screen, which is displayed when the mobile application is successful in locating nearby service nodes, according to an example in which an internet service provider customer installs the user node in an apartment unit.

FIG. 21 is an illustration of the results screen 800, which is displayed when the mobile application 124 is successful in locating nearby service nodes 110, according to an example in which an ISP customer 105 installs the user node 115 in an apartment unit. Here, the results screen 800 includes textual information and graphical elements 802 representing nearby service nodes 110 overlaid on the background image data depicting the interior of the apartment unit.

Figure 22:
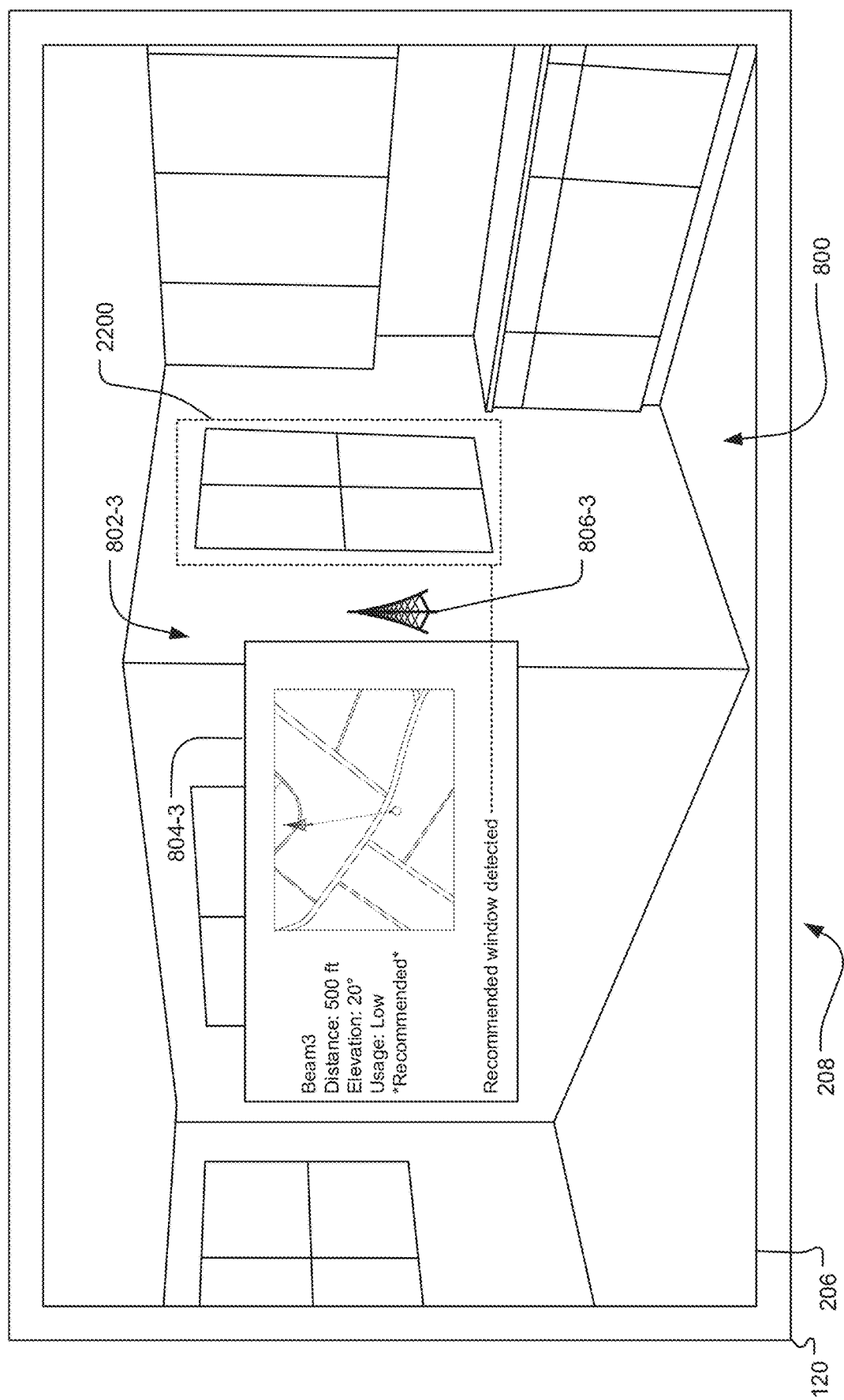
FIG. 22 is an illustration of the results screen showing a graphical element representing a service node with an expanded information pane, according to an example in which an internet service provider customer installs the user node in an apartment unit.

FIG. 22 is an illustration of the results screen 800 showing a graphical element 802-3 with an expanded information pane 804-3, according to an example in which an ISP customer 105 installs the user node 115 in an apartment unit. Here, the expanded information pane 804-3 now includes additional information indicating that a recommended window for installation of the user node 115 has been detected. Also included is a window selection graphic 2200 overlaid on a region of the background image data depicting the recommended window.

In some embodiments, the AR module 220 of the mobile application 124 includes an image analytics capability. This image analytics capability is able to recognize and identify objects of interest within the images captured by the camera 236 of the mobile computing device 120. In one example, these objects include the windows. As a result, the mobile application is able to identify windows within the captured images from the camera and then highlight any windows with bounding boxes, for example. In one example, a bounding box is used to highlight the window that the application 124 determines would be the best window in which to install the user node 115.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system for facilitating installation of a user node in a fixed wireless data network, the system comprising:
a mobile computing device for executing a mobile application, the mobile computing device comprising a display for presenting a graphical user interface, the mobile application using position information for service nodes to facilitate installation of the user node;
wherein the fixed wireless data network includes user nodes installed at premises and service nodes distributed throughout a geographical area at varying distances from the premises, and the user node for which the mobile application facilitates installation is to be installed at a premises.

2. The system as claimed in claim 1, wherein the position information for the service nodes includes the position of the service nodes with respect to the mobile computing device.

3. The system as claimed in claim 2, wherein the position information is generated based on global navigation satellite system location data for the mobile computing device.

4. The system as claimed in claim 1, wherein the position information for the service nodes includes area of coverage information for the service nodes.

5. The system as claimed in claim 1, wherein the display presents graphical elements representing the service nodes in different positions based on the position information.

6. The system as claimed in claim 5, wherein the mobile application renders image data depicting a surrounding area captured by a camera of the mobile computing device on the display with graphical elements overlaid on the image data in different positions with respect to regions of the image data corresponding to positions of the service nodes.

7. The system as claimed in claim 5, wherein the mobile application superimposes the graphical elements into a field of view of a user via the display in different positions with respect to visible portions of the surrounding area in the field of view of the user based on image data captured by a camera of the mobile computing device and the position information.

8. The system as claimed in claim 5, wherein the different positions of the graphical elements representing the service nodes are based on geometric information of the mobile computing device and an area surrounding the mobile computing device.

9. The system as claimed in claim 5, wherein visual characteristics of the graphical elements representing the service nodes are based on recommendation information for the service nodes.

10. The system as claimed in claim 9, wherein the recommendation information includes whether the service nodes are recommended and/or recommended heights of installation of the user node.

11. The system of claim 1, wherein the mobile application uses the position information for the service nodes to facilitate the installation of the user node by providing recommendation information for the service nodes.

12. The system of claim 11, wherein the recommendation information is based on usage information for the service nodes.

13. The system of claim 11, wherein the recommendation information includes whether service nodes are recommended and/or recommended heights of installation of the user node.

14. The system of claim 1, wherein the mobile application uses the position information for the service nodes to facilitate the installation of the user node by providing location information for nearby service nodes.

15. The system of claim 1, wherein the user nodes and service nodes of the fixed wireless data network are installed at fixed points and communicate wirelessly via directional antenna systems.

16. A system for facilitating the installation of a user node in a fixed wireless data network, the system comprising:
  a mobile computing device for executing a mobile application and rendering a graphical user interface on a touchscreen display of the mobile computing device, the mobile application generating geometric information for the mobile computing device and an area surrounding the mobile computing device, and the graphical user interface displaying image data captured by a camera of the mobile computing device and displaying a graphical element representing the user node in a position with respect to the image data, based on the geometric information; the mobile application using position information for service nodes to facilitate installation of the user node, and wherein fixed wireless data network includes user nodes installed at premises and service nodes distributed throughout a geographical area at varying distances from the premises, and the user node for which the mobile application facilitates installation is to be installed at a premises.

17. The system as claimed in claim 16, wherein visual characteristics of the graphical element representing the user node are based on input detected by the graphical user interface.

18. The system as claimed in claim 16, wherein the mobile application generates and stores an image depicting the image data and the graphical element representing the user node that were displayed by the graphical user interface.

19. The system of claim 16, wherein the image data captured by the camera and displayed by the graphical user interface depicts the surrounding area, and the graphical element representing the user node is a virtual antenna overlaid on the displayed image data.

20. The system of claim 19, wherein the mobile application generates and stores an image depicting the virtual antenna as it would look once installed.

21. A method for facilitating installation of a user node in a fixed wireless data network, the method comprising:
  a mobile application executing on a mobile computing device presenting a graphical user interface and using position information for service nodes to facilitate installation of the user node;
  wherein the fixed wireless data network includes user nodes installed at premises and service nodes distributed throughout a geographical area at varying distances from the premises, and the user node for which the mobile application facilitates installation is to be installed at a premises.

22. The method as claimed in claim 21, wherein the position information for the service nodes includes the position of the service nodes with respect to the mobile computing device.

23. The method as claimed in claim 22, further comprising generating the position information based on global navigation satellite system location data for the mobile computing device.

24. The method as claimed in claim 21, wherein the position information for the service nodes includes area of coverage information for the service nodes.

25. The method as claimed in claim 21, further comprising displaying graphical elements representing the service nodes in different positions based on the position information.

26. The method as claimed in claim 25, further comprising rendering image data depicting a surrounding area captured by a camera of the mobile computing device on a display of the mobile computing device with the graphical elements overlaid on the image data in different positions with respect to regions of the image data corresponding to positions of the service nodes.

27. The method as claimed in claim 25, further comprising superimposing the graphical elements into a field of view of a user in different positions with respect to visible portions of the surrounding area in the field of view of the user based on image data captured by a camera of the mobile computing device and the position information.

28. The method as claimed in claim 25, further comprising displaying the graphical elements representing the service nodes in different positions based on geometric information of the mobile computing device and an area surrounding the mobile computing device.

29. The method as claimed in claim 25, wherein visual characteristics of the graphical elements representing the service nodes are based on recommendation information for the service nodes.

30. The method as claimed in claim 29, wherein the recommendation information includes whether the service nodes are recommended and/or recommended heights of installation of the user node.

31. A system for facilitating installation of a user node in a fixed wireless data network, the system comprising:
  a mobile computing device for executing a mobile application, the mobile computing device comprising a display for presenting a graphical user interface, the mobile application using position information for service nodes to facilitate installation of the user node;
  wherein the display presents graphical elements representing the service nodes in different positions based on the position information, visual characteristics of the graphical elements representing the service nodes are based on recommendation information for the service nodes, and the recommendation information is based on usage information for the service nodes.

32. A method for facilitating installation of a user node in a fixed wireless data network, the method comprising:
  a mobile application executing on a mobile computing device presenting a graphical user interface and using position information for service nodes to facilitate installation of the user node; and
  displaying graphical elements representing the service nodes in different positions based on the position information, and
  wherein visual characteristics of the graphical elements representing the service nodes are based on recommendation information for the service nodes and the recommendation information is based on usage information for the service nodes.

* * * * *